United States Patent
Iida

(10) Patent No.: US 9,595,460 B2
(45) Date of Patent: Mar. 14, 2017

(54) SUBSTRATE PROCESSING APPARATUS, RECORDING MEDIUM AND METHOD OF MANUFACTURING SEMICONDUCTOR DEVICE

(71) Applicant: HITACHI KOKUSAI ELECTRIC INC., Tokyo (JP)

(72) Inventor: Tsukasa Iida, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/781,074

(22) PCT Filed: Mar. 26, 2014

(86) PCT No.: PCT/JP2014/058578
§ 371 (c)(1),
(2) Date: Sep. 29, 2015

(87) PCT Pub. No.: WO2014/168006
PCT Pub. Date: Oct. 16, 2014

(65) Prior Publication Data
US 2016/0307783 A1    Oct. 20, 2016

(30) Foreign Application Priority Data

Apr. 10, 2013    (JP) .................................. 2013-082121

(51) Int. Cl.
*H01L 21/02*    (2006.01)
*H01L 21/67*    (2006.01)
(Continued)

(52) U.S. Cl.
CPC ...... *H01L 21/67276* (2013.01); *C23C 16/455* (2013.01); *H01L 21/0228* (2013.01);
(Continued)

(58) Field of Classification Search
CPC .......... H01L 21/0228; H01L 21/67167; G05B 19/4184; C23C 14/0078; C23C 14/22; C23C 14/54; C23C 16/45544
See application file for complete search history.

(56) References Cited

U.S. PATENT DOCUMENTS

| | | | |
|---|---|---|---|
| 5,512,320 | A | 4/1996 | Turner et al. |
| 2009/0226294 | A1 | 9/2009 | Sekido et al. |

FOREIGN PATENT DOCUMENTS

| | | |
|---|---|---|
| JP | 02-030759 A | 2/1990 |
| JP | 06-244124 A | 9/1994 |

(Continued)

*Primary Examiner* — Thanh V Pham
(74) *Attorney, Agent, or Firm* — Volpe and Koenig, P.C.

(57) ABSTRACT

A substrate processing apparatus includes first and second process chambers; a mounting section on which a housing vessel that houses the substrate is mounted; a vacuum transfer chamber that has a vacuum transfer machine to transfer the substrate under a negative pressure; and an atmospheric transfer chamber that has an atmospheric transfer machine that transfers the substrate under an atmospheric pressure. Timing for the atmospheric transfer chamber to take out the substrate from the housing vessel is based on a recipe remaining time, which is a remaining time of substrate processing, and an approach time, which is a time from when the substrate is taken out from the housing vessel till when the substrate is mounted to the vacuum transfer machine.

11 Claims, 3 Drawing Sheets

(51) Int. Cl.
*G05B 19/418* (2006.01)
*C23C 16/455* (2006.01)
*C23C 14/54* (2006.01)
*H01L 21/477* (2006.01)
*H01L 21/683* (2006.01)

(52) U.S. Cl.
CPC .. *H01L 21/02263* (2013.01); *H01L 21/02266* (2013.01); *H01L 21/477* (2013.01); *H01L 21/67167* (2013.01); *H01L 21/6838* (2013.01)

(56) References Cited

FOREIGN PATENT DOCUMENTS

| | | |
|---|---|---|
| JP | 11-102951 A | 4/1999 |
| JP | 2001-102424 A | 4/2001 |
| JP | 2003-109995 A | 4/2003 |
| JP | 2005-136021 A | 5/2005 |
| JP | 2007-129177 A | 5/2007 |
| WO | 2005/055314 A1 | 6/2005 |

SUBSTRATE PROCESSING APPARATUS, RECORDING MEDIUM AND METHOD OF MANUFACTURING SEMICONDUCTOR DEVICE

TECHNICAL FIELD

The present disclosure relates to a substrate processing apparatus that processes a substrate, for example, a semiconductor wafer and the like, a non-transitory computer readable recording medium that stores a program executed by the substrate processing apparatus, and a method of manufacturing a semiconductor device by processing a substrate such as a semiconductor wafer, and particularly to a transfer control technique of a substrate in an apparatus that performs processing of one or multiple substrates in one process chamber.

RELATED ART

Conventionally, a transfer control of a substrate has been performed in a semiconductor manufacturing apparatus which is a type of the substrate processing apparatus.

Patent Document 1 to be described below discloses a method of matching a point of time at which vacuuming of a load lock chamber for vacuum transfer ends, with a point of time at which substrate processing in a process chamber ends. Patent Document 2 discloses a method of performing control such that a substrate is transferred to a preliminary chamber at regular time intervals. Patent Document 3 describes a substrate processing apparatus in which a plurality of processing chambers has different processing time, and which is controlled such that intervals of loading substrates into the processing chambers are made constant, and the substrates are not stagnated in the processing chambers.

In the related art, in a multiple wafer type apparatus as an embodiment of a substrate processing apparatus, transfer of a substrate to be processed in a subsequent process chamber is started in parallel with recovery of a processed substrate in order to improve throughput. However, there is a problem of generating stagnation of the processed substrate in the process chamber.

PRIOR ART DOCUMENTS

Patent Documents

Patent Document 1: JP 2003-109995 A
Patent Document 2: JP 2005-136021 A
Patent Document 3: WO 2005-055314 A An object of the present disclosure is to provide a substrate processing apparatus or a method of manufacturing semiconductor device that solves the problem in the substrate transfer of the above-described substrate processing apparatus, and performs a transfer control of suppressing stay of a processed substrate in the apparatus.

SUMMARY

According to one aspect of the present invention, there is provided a substrate processing apparatus, including: a plurality of process chambers that process a substrate; a mounting section on which one or more housing vessels that house the substrate is mounted; a vacuum transfer chamber that has a vacuum transfer machine to transfer the substrate under a negative pressure; an atmospheric transfer chamber that has an atmospheric transfer machine to transfer the substrate under an atmospheric pressure; and a control section that determines a timing for the atmospheric transfer machine to take out the substrate from the housing vessel based on a recipe remaining time, which is a remaining time of substrate processing in each of the plurality of process chambers, and an approach time, which is a time from when the substrate is taken out from the housing vessel till when the substrate is mounted to the vacuum transfer machine, when the substrate is transferred from the housing vessel to a predetermined process chamber among the process chambers after the substrate is transferred to the plurality of process chambers from the housing vessel mounted to the mounting section via the atmospheric transfer chamber and the vacuum transfer chamber and the substrate processing is started in the plurality of process chambers.

According to another aspect of the present invention, there is provided a non-transitory computer-readable recording medium that stores a program to be executed by a substrate processing apparatus, the substrate processing apparatus including: a plurality of process chambers that process a substrate; a vacuum transfer chamber that has a vacuum transfer machine to transfer the substrate under a negative pressure; an atmospheric transfer chamber that has an atmospheric transfer machine to transfer the substrate under an atmospheric pressure; and a control section that transfers the substrate to the process chamber via the atmospheric transfer chamber and the vacuum transfer chamber, the program causing the control section to execute a timing determination step of determining a timing for the atmospheric transfer machine to take out the substrate from the housing vessel based on a recipe remaining time, which is a remaining time of substrate processing in a predetermined process chambers, and an approach time, which is a time until the substrate is mounted to the vacuum transfer machine when the substrate is transferred to the predetermined process chamber after the substrate processing is started in the plurality of process chambers.

According to a still another aspect of the present invention, there is provided a method of manufacturing semiconductor device, the method comprising:

a substrate transfer step of transferring a substrate method, including: a substrate transfer step of transferring a substrate via an atmospheric transfer chamber to which the substrate is transferred under an atmospheric pressure, and a vacuum transfer chamber to which the substrate is transferred under a negative pressure to a plurality of process chambers in which the substrates are processed; a substrate processing step of performing a predetermined processing to the substrate in the plurality of process chambers; and a timing determination step of determining a timing for the atmospheric transfer machine to transfer the substrate based on a recipe remaining time, which is a remaining time of substrate processing in each of the plurality of process chambers, and an approach time, which is a time until the substrate is mounted to the vacuum transfer machine when the substrate is transferred to a predetermined process chamber among the plurality of process chambers after starting the substrate processing in the plurality of process chambers.

According to the configuration described above, it is possible to suppress the stay of the processed substrate in the substrate processing apparatus.

DETAILED DESCRIPTION (1) Configuration of Substrate Processing Apparatus

Hereinafter, a description will be made regarding a substrate processing apparatus according to an embodiment of the present disclosure. In the present embodiment, the substrate processing apparatus is configured as a semiconductor manufacturing apparatus that performs processing steps in a method of manufacturing a semiconductor device (IC: Integrated Circuit) as an example. In addition, the substrate processing apparatus of the present embodiment is a multiple wafer type apparatus that performs substrate processing including a film deposition process such as a CVD (Chemical Vapor Deposition) process on a plurality of (for example, five) substrates in one process chamber.

Figure 1:
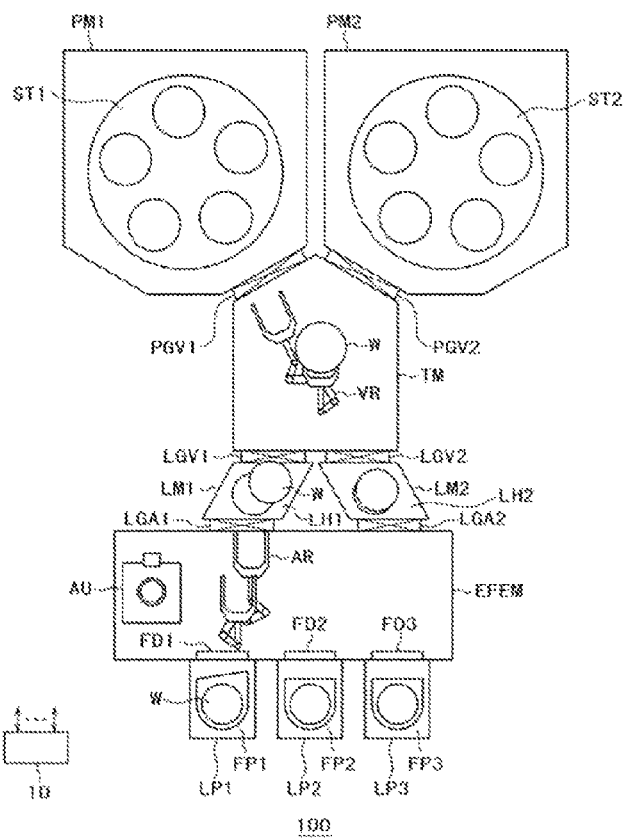
FIG. 1 is a configuration diagram (a top view) of a substrate processing apparatus according to an embodiment of the present disclosure.

FIG. 1 is a configuration diagram of the substrate processing apparatus according to the embodiment of the present disclosure, and is an apparatus image view that is seen from a top surface. A substrate processing apparatus 100 illustrated in FIG. 1 is provided with a configuration of a vacuum side that handles the substrate (for example, a wafer W made of silicon and the like) in a reduced pressure state, and a configuration of an atmosphere side that handles the wafer W in an atmospheric pressure state. The vacuum side configuration mainly includes a vacuum transfer chamber TM, chambers serving as both a preliminary chamber and a cooling chamber (hereinafter, simply referred to also as a cooling chamber) LM1 and LM2, and process chambers PM1 and PM2 that process the wafer W. The atmosphere side configuration mainly includes an atmospheric transfer chamber EFEM (Equipment Front End Module), and load ports LP1 to LP3 serving as a mounting section.

Pods (FOUP: Front Opening Unified Pod) FP1 to FP3 serving as a wafer carrier (wafer housing vessel) that houses the wafer W are transferred from outside of the substrate processing apparatus and mounted, respectively, to the load ports LP1 to LP3, and further, are transferred to the outside of the substrate processing apparatus. According to such a configuration, for example, the unprocessed wafer W is taken out from the pod FP1 on the load port LP1, passes via the cooling chamber LM1, and then is loaded into the process chamber PM1 and processed. Then, the processed wafer W is returned to the pod FP1 on the load port LP1 in the reverse order.

(Configuration of Vacuum Side)

The vacuum transfer chamber TM is configured to have a structure that can be vacuum-air-tightly closed so as to withstand a negative pressure (reduced pressure) of less than an atmospheric pressure such as a vacuum state. Incidentally, in the present embodiment, a casing of the vacuum transfer chamber TM is formed into a pentagon in a plan view, and is formed into a box shape in which both upper and lower ends thereof are closed. The cooling chambers LM1 and LM2, and the process chambers PM1 and PM2 are adjacently arranged so as to surround an outer periphery of the vacuum transfer chamber TM.

For example, one vacuum transfer robot VR, which serves as a transfer means (substrate transfer machine) for transferring the wafer W in the reduced pressure state is provided in the vacuum transfer chamber TM. The vacuum transfer robot VR performs transfer of the wafer W mutually between the cooling chambers LM1 and LM2, and the process chambers PM1 and PM2 by placing the wafer W on two pairs of substrate supporting arms (hereinafter, the arm) being a substrate mounting section. Incidentally, the vacuum transfer robot VR is configured to be capable of being elevated while maintaining an air-tight property of the vacuum transfer chamber TM. In addition, the two pairs of arms are provided to be spaced apart from each other in a vertical direction, and are configured such that each of the arms can be extended or retracted in a horizontal direction, and can be rotatably moved in such a horizontal plane.

A plurality of (for example, two of) the process chambers PM1 and PM2 can be connected to the vacuum transfer chamber TM. The plurality of process chambers PM1 and PM2 may be process chambers (for example, film deposition chambers for the same film type) which perform the same processings or may be process chambers (for example, film deposition chambers for different film types) which perform different processings depending on a purpose of the multiple wafer type apparatus 100. The process chambers PM1 and PM2 are provided with substrate mounting stages ST1 and ST2, respectively, to which the wafer W is mounted, and are configured as, for example, multiple wafer type process chambers that collectively process every five wafers W in a pressure-reduced state.

In addition, the process chambers PM1 and PM2, respectively, are provided with various configurations depending on each function thereof, for example, a gas introduction mechanism, an exhaust mechanism, a pressure adjustment mechanism, a temperature control mechanism, a plasma discharge mechanism and the like. These configurations include a mass flow controller (MFC) that controls a flow rate of process gas to be supplied in the process chambers PM1 and PM2, a pressure controller 15 such as an auto pressure controller (APC) that controls each pressure in the process chambers PM1 and PM2, a temperature adjuster that controls each temperature in the process chambers PM1 and PM2, a valve digital I/O 19 that controls the supply of the process gas and on/off of an exhaust valve, a SW digital I/O 18 that controls on/off of various switches (SW), and the like. Each of the configurations described above is electrically connected to a process chamber controller 14. A description will be made later regarding a configuration of a control section 10 serving as an apparatus controller including the process chamber controller 14.

In addition, the process chambers PM1 and PM2, respectively, are continuously connected to the vacuum transfer chamber TM by process chamber gate valves PGV1 and PGV2 serving as an on-off valve. Accordingly, it is possible to perform the transfer of the wafer W under the reduced pressure between the process chambers PM1 and PM2, and the vacuum transfer chamber TM by opening the process chamber gate valves PGV1 and PGV2. In addition, it is possible to perform various types of substrate processing with respect to the wafer W while holding the pressure in the process chambers PM1 and PM2 and a process gas atmosphere by closing the process chamber gate valves PGV1 and PGV2.

The chambers serving as both the preliminary chamber and the cooling chamber LM1 and LM2 function as a preliminary chamber that loads the wafer W into the vacuum transfer chamber TM, or a preliminary chamber that unloads the wafer W from the vacuum transfer chamber TM. Substrate holding stages LH1 and LH2, which temporarily hold the wafer W when the wafer W is loaded and unloaded, are provided in the cooling chambers LM1 and LM2, respectively. Each of the substrate holding stages LH1 and LH2 may be configured as a multi-stage slot that holds the plurality of (for example, two) wafers W.

In addition, the cooling chambers LM1 and LM2, respectively, are continuously connected to the vacuum transfer chamber TM by vacuum side gate valves LGV1 and LGV2 serving as an on/off valve, and further, are continuously connected to the atmospheric transfer chamber EFEM, which will be described later, by atmosphere side gate valves LGA1 and LGA2 serving as an on/off valve. Accordingly, it is possible to perform the transfer of the wafer W under the atmospheric pressure between the cooling chambers LM1 and LM2, and the atmospheric transfer chamber EFEM while maintaining the vacuum air-tightness in the vacuum transfer chamber TM by opening the atmosphere side gate valves LGA1 and LGA2 at the atmospheric transfer chamber EFEM side while closing the vacuum side gate valves LGV1 and LGV2 at the vacuum transfer chamber TM side.

In addition, the cooling chambers LM1 and LM2 are configured to have the structure that can withstand the negative pressure of less than the atmospheric pressure such as the vacuum state, so that insides thereof can be vacuum-exhausted respectively. Accordingly, it is possible to perform the transfer of the wafer W under the reduced pressure between the cooling chambers LM1 and LM2, and the vacuum transfer chamber TM while maintaining the vacuum state in the vacuum transfer chamber TM by opening the vacuum side gate valves LGV1 and LGV2 at the vacuum transfer chamber TM side after vacuum-evacuating the inside of the cooling chambers LM1 and LM2 by closing the atmosphere side gate valves LGA1 and LGA2 at the atmospheric transfer chamber EFEM side. In this manner, the cooling chambers LM1 and LM2 are configured to be capable of switching the atmospheric pressure state and a negative pressure state.

In addition, the cooling chambers LM1 and LM2 are configured to hold the wafer W processed in the process chamber PM1 or PM2, by each of the substrate holding stages LH1 and LH2, and perform cooling to equal to or lower than a predetermined temperature. For example, the wafer W held by the substrate holding stages LH1 and LH2 is cooled in the atmospheric pressure state or the negative pressure state, for example, in a state where the air pressure in the cooling chambers LM1 and LM2 is maintained at a predetermined value by introducing inert gas into the cooling chambers LM1 and LM2 and performs exhaust.

(Configuration of Atmosphere Side)

On the other hand, at the atmosphere side of the substrate processing apparatus 100, there are provided the atmospheric transfer chamber EFEM, which is a front module connected to the cooling chambers LM1 and LM2, as described above, and the load ports LP1 to LP3 serving as a housing vessel mounting section on which the pods FP1 to FP3 as the housing vessel housing twenty-five wafers W per one lot is mounted, so as to be adjacently connected to the atmosphere transfer chamber EFEM.

For example, one atmospheric transfer robot AR is provided as the transfer means (substrate transfer machine) in the atmospheric transfer chamber EFEM. The atmospheric transfer robot AR performs the transfer of the wafer W mutually between the cooling chambers LM1 and LM2, and the load ports LP1 to LP3. The atmospheric transfer robot AR also has two pairs of arms, which are the substrate mounting sections, as similarly to the vacuum transfer robot VR.

In addition, a wafer aligner AU, which is an orientation flat aligning apparatus for performing positional alignment of a crystal orientation of the wafer W, is provided in the atmosphere transfer chamber EFEM as a substrate position adjustment apparatus. In a case where the wafer W is a notch type, it is possible to provide the wafer aligner AU as a notch aligning apparatus. In addition, a clean air unit (not illustrated) that supplies clean air into the atmosphere transfer chamber EFEM, is provided in the atmosphere transfer chamber EFEM.

Each of the load ports LP1 to LP3 is configured to mount the pods FP1 to FP3 in which the plurality of wafers W is housed, on each of the load ports LP1 to LP3. The twenty-five slots per one lot, for example, are provided as a housing section in which the wafers W are housed, respectively, in the pods FP1 to FP3. When the pods FP1 to FP3 are mounted to the load ports LP1 to LP3, respectively, a transfer system controller 13, which will be described later, is configured to read and store barcodes and the like indicating a carrier ID, which is given to the pods FP1 to FP3 so as to identify the pods FP1 to FP3.

In addition, in some cases, a dummy pod FPD is resident in the load port LP3 for example, out of the load ports LP1 to LP3, as the housing vessel in which the wafer W serving as a dummy substrate is housed. In this case, the wafer W serving as a product substrate is housed in the pod FP1 or the pod FP2, is mounted to the load port LP1 or the load port LP2, is transferred into the substrate processing apparatus 100, and is subjected to the various types of substrate processing. As described above, the description has been made regarding the substrate processing apparatus of the present embodiment, but the number, configuration and combination of the respective chambers are not limited thereto, and can be suitably selected.

Hereinafter, it will be called a process chamber PM in the case of referring any one of the process chambers PM1 and PM2, a cooling chamber LM in the case of referring any one of the cooling chambers LM1 and LM2, a substrate holding stage LH in the case of referring any one of the substrate holding stage LH1 or LH2, a load port LP in the case of referring any one of the load ports LP1 to LP3, a pod FP in the case of referring any one of the pods FP1 to FP3, and a substrate mounting stage ST in the case of referring any one of the substrate mounting stage ST1 or ST2.

Next, a description will be made regarding a substrate transfer method in the substrate processing apparatus 100 with reference to FIG. 1.

The processing procedure of the wafer W will be described. The substrate processing apparatus 100 starts the wafer transfer with respect to the film deposition chambers PM1 and PM2 from the pods FP1 to FP3 when the film deposition instruction is given with respect to the wafers W, which is mounted to the load ports LP1 to LP3, in the pods FP1 to FP3 by a user interface (GUI or host) (not illustrated). Twenty-five wafers W1 to W25 are respectively housed in the pods FP1 to FP3. The twenty-five wafers W are taken out and processed in an order from the wafer W1 to W25.

First, for example, a FOUP door FD1 is opened by a pod opener (not illustrated), and the atmospheric transfer robot AR takes out one wafer W (the wafer W1) in the pod FP1 and causes the wafer W1 to be mounted to the wafer aligner AU. The wafer aligner AU adjusts a position of the mounted wafer W1, and more particularly, adjusts the position in the horizontal direction (an X direction, a Y direction and a circumferential direction), parallel to a wafer plane, of the wafer W1.

While the wafer aligner AU adjusts the position of the wafer W1, the atmospheric transfer robot AR takes out one subsequent wafer W (the wafer W2) in the pod FP1, and waits until the position adjustment of the wafer W1 ends. When the position adjustment of the wafer W1 ends, the atmospheric transfer robot AR exchanges the wafer W2 held by the atmospheric transfer robot AR with the wafer W1 held by the wafer aligner AU. Since the atmospheric transfer robot AR is provided with two arms as illustrated in FIG. 1, the wafer W1 held by the wafer aligner AU is taken out using the arm that does not hold the wafer W2, and immediately after then, the wafer W2 held by the other arm is mounted to the wafer aligner AU. The wafer aligner AU performs the position adjustment of the wafer W2 that has been newly mounted thereto.

The atmospheric transfer robot AR holding the wafer W1 taken out from the wafer aligner AU causes the wafer W1 to be mounted to the substrate holding stage LH1 of the cooling chamber LM1 when the atmosphere side gate valve LGA1 of the cooling chamber LM1 is opened, for example. At this time, the vacuum side gate valve LGV1 of the cooling chamber LM1 is closed, and the negative pressure in the vacuum transfer chamber TM is maintained. After the wafer W1 is mounted to the substrate holding stage LH1, the atmosphere side gate valve LGA1 of the cooling chamber LM1 is closed, and the cooling chamber LM1 is exhausted to be the negative pressure by an exhaust apparatus (not illustrated).

While the negative pressure exhaust of the cooling chamber LM1 is performed, the atmospheric transfer robot AR takes out one subsequent wafer W (the wafer W3) in the pod FP1, and exchanges the wafer W3 held by the atmospheric transfer robot AR with the wafer W2 held by the wafer aligner AU when the position adjustment of the wafer W2 ends in the wafer aligner AU. The wafer aligner AU performs the position adjustment of the wafer W3 that has been newly mounted thereto.

The atmospheric transfer robot AR causes the wafer W2 to be mounted to the substrate holding stage LH2 of the cooling chamber LM2 when the atmosphere side gate valve LGA2 of the cooling chamber LM2 is opened. Incidentally, the atmospheric transfer robot AR is configured to mount the wafer W to the substrate holding stage LH when there is a free space in any one of the substrate holding stage LH. In this example, when there is a free space in the substrate holding stage LH1 of the cooling chamber LM1 or the substrate holding stage LH2 of the cooling chamber LM2, the wafer W is mounted to the substrate holding stage LH1 or the substrate holding stage LH2. If there is a case where none of the substrate holding stage LH is free, the atmospheric transfer robot AR is not allowed to mount the wafer W to the substrate holding stage LH, and thus, stops and waits in the state of mounting the wafer W at a position immediately before the cooling chamber LM until there is a free space in the substrate holding stages LH so as to mount the wafer W.

Hereinafter, the atmospheric transfer robot AR repeatedly performs a taking out operation of the wafer W from the pod FP, an exchanging operation with the wafer W held by the wafer aligner AU, and a mounting operation to the substrate holding stage LH until completing the scheduled number of the film deposition that has been instructed.

When the cooling chamber LM1 is pressure-reduced to a pressure value (negative pressure value), which has been set in advance by the negative pressure exhaust operation of the cooling chamber LM1 after the wafer W1 is mounted to the substrate holding stage LH1, the vacuum side gate valve LGV1 of the cooling chamber LM1 is opened. Subsequently, the vacuum transfer robot VR takes out one wafer (the wafer W1) from the substrate holding stage LH1 of the cooling chamber LM1. After the wafer W1 is taken out from the cooling chamber LM1, the vacuum side gate valve LGV1 is closed, and the cooling chamber LM1 returns to the atmospheric pressure. In this manner, a preparation of mounting one subsequent wafer W3 to the substrate holding stage LH1 of the cooling chamber LM1 is performed.

The vacuum transfer robot VR causes the wafer W1 to be mounted to the substrate mounting stage ST1 of the process chamber PM1 since the process chamber gate valve PGV1 is opened while the cooling chamber LM1 returns to the atmospheric pressure. Incidentally, the vacuum transfer robot VR is configured to mount the wafer W to the substrate mounting stage ST in a case where the process chamber PM designated for the corresponding wafer is not in the middle of performing or after having performed the substrate processing, and there is a free space in the substrate mounting stage ST of the process chamber PM. In this example, when there is a free space in the substrate mounting stage ST1 of the process chamber PM1, the wafer W is mounted. If there is a case where none of the substrate mounting stage ST of the designated process chamber PM is free, it is not allowed to mount the wafer W to the substrate mounting stage ST, and thus, the vacuum transfer robot VR stops and waits in the state of mounting the wafer W at a position immediately before the process chamber PM until it is allowed to mount the wafer W to the substrate mounting stage ST, that is, until the processing of the process chamber PM ends. Further, when the processing ends, the processed wafer W on the substrate mounting stage ST is exchanged with the unprocessed wafer W on the vacuum transfer robot VR.

When the wafer W1 is mounted to the substrate mounting stage ST1 of the process chamber PM1, the process chamber gate valve PGV1 is closed. Hereinafter, the vacuum transfer robot VR repeatedly performs a taking out operation of the wafer W from the substrate holding stage LH, and a mounting operation to the substrate mounting stage ST of the process chamber PM until completing the scheduled number for the film deposition process that has been instructed.

In this manner, when the substrate mounting stage ST1 of the process chamber PM1 is filled with the wafer W (for example, the five wafers W1 to W5), the substrate processing such as the film deposition is started.

When a desired substrate processing ends in the process chamber PM1, the process chamber gate valve PGV1 is opened, and the vacuum transfer robot VR takes out one wafer W (the wafer W1) from the substrate mounting stage ST1. At this time, in a case where the vacuum transfer robot VR holds the unprocessed wafer W6 which is scheduled to be processed in the process chamber PM1, the unprocessed wafer W6 is exchanged with the processed wafer W1 on the substrate mounting stage ST1.

After the wafer W1 is taken out from the process chamber PM1, the process chamber gate valve PGV1 is closed. The vacuum transfer robot VR, which holds the wafer W1 taken out from the process chamber PM1, causes the wafer W1 to be mounted to the substrate holding stage LH1 of the cooling chamber LM1 when the vacuum side gate valve LGV1 is opened. At this time, in a case where the cooling chamber LM1 is in the atmospheric pressure state, the vacuum side gate valve LGV1 is opened after the inside of the cooling chamber LM1 is set to the negative pressure by an exhaust apparatus (not illustrated), then the wafer W1 is mounted to the substrate holding stage LH1. In a case where the unprocessed wafer W7 is present in the substrate holding stage LH1 of the cooling chamber LM1, the unprocessed wafer W7 is exchanged with the wafer W1 held by the vacuum transfer robot VR.

When the mounting of the wafer W1 to the cooling chamber LM1 ends, the vacuum side gate valve LGV1 is closed, the inert gas is introduced into the cooling chamber LM1 by an inert gas introduction apparatus (not illustrated), and the pressure in the cooling chamber LM1 returns to the atmospheric pressure. At the same time, the cooling process is started with respect to the wafer W1 mounted to the substrate holding stage LH1 in accordance with time that has been set in advance. The cooling process is performed by, for example, introducing the inert gas at room temperature into the cooling chamber LM1, and performs the exhaust.

Incidentally, when there is a free space in any one of the substrate holding stage LH of the cooling chamber LM, and further, there is the wafer W in the middle of or after being processed in any one of the process chamber PM, the cooling process of the processed wafer W in the cooling chamber LM is performed, but the corresponding cooling chamber LM is not returned to the atmospheric pressure, and the inside of the cooling chamber LM is maintained in the negative pressure. In other words, when none of the substrate holding stage LH of the cooling chamber LM is free, or there is no wafer W in the middle of or after being processed in any one of the process chamber PM, the cooling chamber LM is returned to the atmospheric pressure. This allows the processed wafer W to be unloaded from the process chamber PM to the cooling chamber LM in a period of time as short as possible, and to be returned to the pod FP in a period of time as short as possible. That is, it allows the substrate processing in the substrate processing apparatus 100 to be completed in a period of time as short as possible. Accordingly, in a case where there is the wafer W in the middle of or after being processed in the process chamber PM, the inside of the cooling chamber LM is maintained in the negative pressure until being filled with the wafer W. When the inside of the cooling chamber LM is filled with the wafer W, and further, the cooling process of the processed wafer W ends, the pressure in the cooling chamber LM1 is returned to the atmospheric pressure.

When the wafer W1 is mounted into the cooling chamber LM1, and further, the pressure in the cooling chamber LM1 is returned to the atmospheric pressure, the atmosphere side gate valve LGA1 is opened. Subsequently, the one wafer W (the wafer W1) is taken out from the substrate holding stage LH1 of the cooling chamber LM1 by the atmospheric transfer robot AR. At this time, in a case where the unprocessed wafer W is held by the atmospheric transfer robot AR, the unprocessed wafer W is exchanged with the wafer W1 on the substrate holding stage LH1.

After the wafer W1 is taken out from the cooling chamber LM1, the atmosphere side gate valve LGA1 is closed, the inside of the cooling chamber LM1 is exhausted to set to the negative pressure as a preparation for mounting the subsequently processed wafer W to the substrate holding stage LH1 of the cooling chamber LM1. Further, when the subsequently processed wafer W is mounted to the substrate holding stage LH1, and the above-described atmospheric pressure return condition of the cooling chamber LM1 is satisfied, the inert gas is introduced into the cooling chamber LM1 again, and the pressure in the cooling chamber LM1 returns to the atmospheric pressure, and the cooling process is performed with respect to the wafer W mounted to the substrate holding stage LH1.

The atmospheric transfer robot AR holding the wafer W1 taken out from the cooling chamber LM1 houses the wafer W1 in the pod FP1 on the load port LP1. By repeating the operations described above, the substrate processing of the twenty-five wafers W housed in the pod FP1 is sequentially performed.

Figure 5:
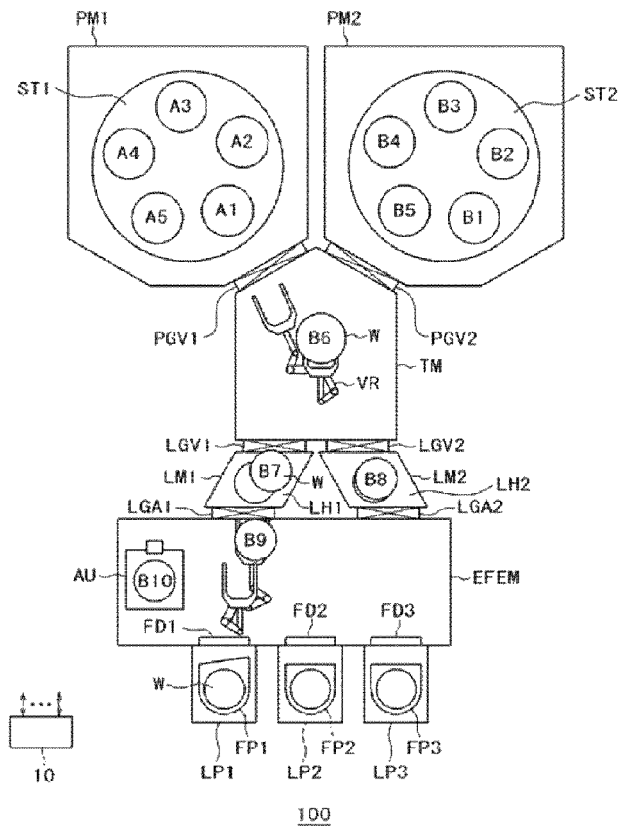
FIG. 5 is a diagram for describing a first problem in the present disclosure.

In the substrate transfer method described above, there is a problem that the substrate taken out from the pod FP is stagnated in the substrate processing apparatus. FIG. 5 is a diagram for describing a first problem. In the example of FIG. 5, the wafers W (A1 to A5) of a group A, taken out from the pod FP1, are transferred to the process chamber PM1 and processed, and then, are returned to the pod FP1. The wafers W (B1 to B25) of a group B, taken out from the pod FP2, are transferred to the process chamber PM2 and processed, and then, are returned to the pod FP2 after the group A is transferred to the process chamber PM1.

The processing of the wafers A1 to A5 of the group A, which has been mounted to the process chamber PM1, is started first, the processing of the wafers B1 to B5 of the group B, which has been mounted to the process chamber PM2, is started next, and then, each processing of the group A and the group B is performed in parallel. Each processing in the process chamber PM1 and the process chamber PM2 may be the same processing, or may be different processing.

The wafer W is disposed in the substrate processing apparatus 100 as illustrated in FIG. 5 at a time at which the substrate processing of the wafers A1 to A5 of the group A ends. That is, the processed wafers A1 to A5 are present in the process chamber PM1, the wafers B1 to B5 in the middle of being processed are present in the process chamber PM2, and an unprocessed wafer B6 is present on the vacuum transfer robot VR. This is because, as described above, the vacuum transfer robot VR is configured to mount the wafer W to the free substrate mounting stage ST in a case where the designated process chamber PM of the wafer transfer destination is not in the middle of or after having performed the substrate processing, and there is a free space in the substrate mounting stage ST of the corresponding process chamber PM, and to stop and wait at the position immediately before the process chamber PM until the wafer W is allowed to be mounted to the substrate mounting stage ST in a case where there is no free space in the substrate mounting stage ST. Further, it is configured such that the processed wafer W on the substrate mounting stage ST is exchanged with the unprocessed wafer W on the vacuum transfer robot VR when the processing ends.

In this manner, at a point of time at which the substrate processing of the wafers A1 to A5 of the group A to be processed first ends, the unprocessed wafer B6 of the group B to be processed later waits, on the vacuum transfer robot VR, for being exchangeable with the processed wafer B1 in the process chamber PM2 after the substrate processing of the group B in the process chamber PM2 ends. Accordingly, the wafers A1 to A5 of the group A are stagnated in the process chamber PM1 until the substrate processing of the wafers B1 to B25 of the group B ends.

A description will be made regarding a specific example of remaining time in the example of FIG. 5. In this example, the substrate processing of the group B to be processed later is started immediately before the substrate processing of the group A to be processed first ends. As described above, the twenty-five wafers W (B1 to B25) of the group B are housed in the pod FP2. In this multiple wafer type apparatus, m (five in the example of FIG. 5) wafers W can be simultaneously processed per one substrate processing, and thus, the substrate processing is performed with respect to the twenty-five wafers W of the group B (25/m) times (round up the first decimal place). In the example of FIG. 5, the substrate processing is performed (25/5=5) times.

Since the unprocessed wafer of the group B is transferred to the vacuum transfer chamber TM until the scheduled number (twenty five) to be processed that has been instructed is completed, the vacuum transfer robot VR is not free until transferring the scheduled number to be processed that has been instructed to the process chamber PM2. Further, the processed wafers A1 to A5 in the process chamber PM1 is not unloaded as long as the vacuum transfer robot VR is not free. Accordingly, in a case where a time for one-time process in the process chamber PM2 is set to n seconds, the processed wafers A1 to A5 of the group A in the process chamber PM1 are stagnated in the process chamber PM1 for the total time of a time for which the substrate processing is performed $\{(25/m)-1\}$ times in the process chamber PM2, and a time for which the processed wafer and the unprocessed wafer are exchanged with each other in the process chamber PM2. That is, the processed wafers A1 to A5 of the group A in the process chamber PM1 are stagnated for a time until the wafers B21 to B25 of the group B are transferred to the process chamber PM2 so that, are stagnated in the process chamber PM1 at least for $\{(25/m)-1\}n$ seconds, that is, a time for which the substrate processing is performed $\{(25/m)-1\}$ times in the process chamber PM2. In the example of FIG. 5, the processed wafers A1 to A5 of the group A in the process chamber PM1 are stagnated at least for $\{(25/5)-1\}$, that is, $4n$ seconds.

Figure 6:
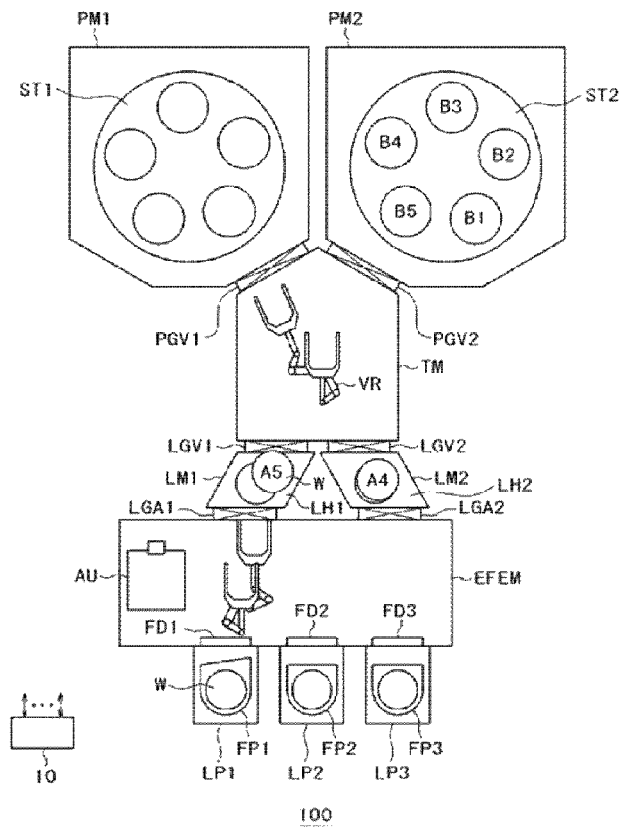
FIG. 6 is a diagram for describing a second problem in the present disclosure.

Next, a description will be made regarding a second problem with reference to FIG. 6. In the example of FIG. 6, the wafers W (A1 to A5) of the group A taken out from the pod FP1 are transferred to the process chamber PM1 and processed, and then are returned to the pod FP1. The wafers W (B1 to B5) of the group B taken out from the pod FP2 are transferred to the process chamber PM2 and processed, and then are returned to the pod FP2 after the group A is transferred to the process chamber PM1.

The wafer W is disposed in the substrate processing apparatus 100 as illustrated in FIG. 6 in a state where the wafers B1 to B5 of the group B are in the middle of the substrate processing or are processed. That is, the wafers B1 to B5 in the middle of or after being processed are present in the process chamber PM2, the processed wafer A5 is present in the cooling chamber LM1, the processed wafer A4 is present in the cooling chamber LM2, and the wafers A4 and A5 are stagnated in the cooling chambers LM1 and LM2 in the negative pressure state. This is because, as described above, it is configured such that the cooling process of the processed wafer W in the cooling chamber LM is performed, but the cooling chamber LM is not returned to the atmospheric pressure, and the inside of the corresponding cooling chamber LM is maintained in the negative pressure when there is a free space in any one of the substrate holding stage LH of the cooling chamber LM, and further, the wafer W in the middle of or after being processed is present in any one of the process chamber PM.

In this manner, since the wafers B1 to B5 in the middle of or after being processed are present in the process chamber PM2, each inside of the cooling chambers LM1 and LM2 is maintained in the negative pressure. Accordingly, the atmospheric transfer robot AR is not allowed to take out the wafers A4 and A5 in the cooling chambers LM1 and LM2. Further, when the processing of the wafers of the group B ends, the processed wafer is loaded into the cooling chambers LM1 and LM2 from the inside of the process chamber PM2, and there is no free space in the substrate holding stage LH1 and LH2 of the cooling chambers LM1 and LM2, the cooling chambers LM1 and LM2 are returned to the atmospheric pressure. Then, the atmospheric transfer robot AR takes out the wafers A4 and A5 in the cooling chambers LM1 and LM2, to be returned to the pod FP1. In this manner, the wafers A4 and A5 of the group A are stagnated in the cooling chambers LM1 and LM2 until the substrate processing of the wafer of the group B ends and the processed wafer is loaded into the cooling chambers LM1 and LM2 from the inside of the process chamber PM2.

A description will be made regarding a specific example of the remaining time in the example of FIG. 6. In this example, the substrate processing of the group B to be processed later is started immediately after the wafers A4 and A5 of the group A to be processed first are mounted to the cooling chambers LM1 and LM2. As described above, the cooling chambers LM1 and LM2 are maintained in the negative pressure state for the group B to be processed later. Accordingly, the wafers A4 and A5 of the group A are not taken out from the cooling chambers LM1 and LM2 until the substrate processing of the group B to be processed later ends, the vacuum transfer robot VR causes the wafer of the group B, to be processed later, to be mounted to the cooling chambers LM1 and LM2, and the cooling chambers LM1 and LM2 are returned to the atmospheric pressure.

Accordingly, in a case where a processing time for one-time process in the process chamber PM2 is set to n seconds, and a time until the cooling chambers LM1 and LM2 are returned to the atmospheric pressure from the negative pressure is set to p seconds, the wafers A4 and A5 of the group A are stagnated for (n+p) seconds in the cooling chambers LM1 and LM2 unless a transfer time of the vacuum transfer robot VR is considered.

Thus, the inventor of the present disclosure has realized the substrate transfer control of solving the first problem or the second problem described above, and suppressing the stagnation of the processed substrate in the substrate processing apparatus. Accordingly, in the present embodiment, it is possible to efficiently perform the substrate transfer while suppressing the stagnation of the substrate, thereby improving throughput than the above-described substrate transfer. Further, a description will be made later regarding improved aspects (a first example and a second example) of the present embodiment in which the substrate does not remain.

(2) Configuration of Apparatus Controller

Figure 2:
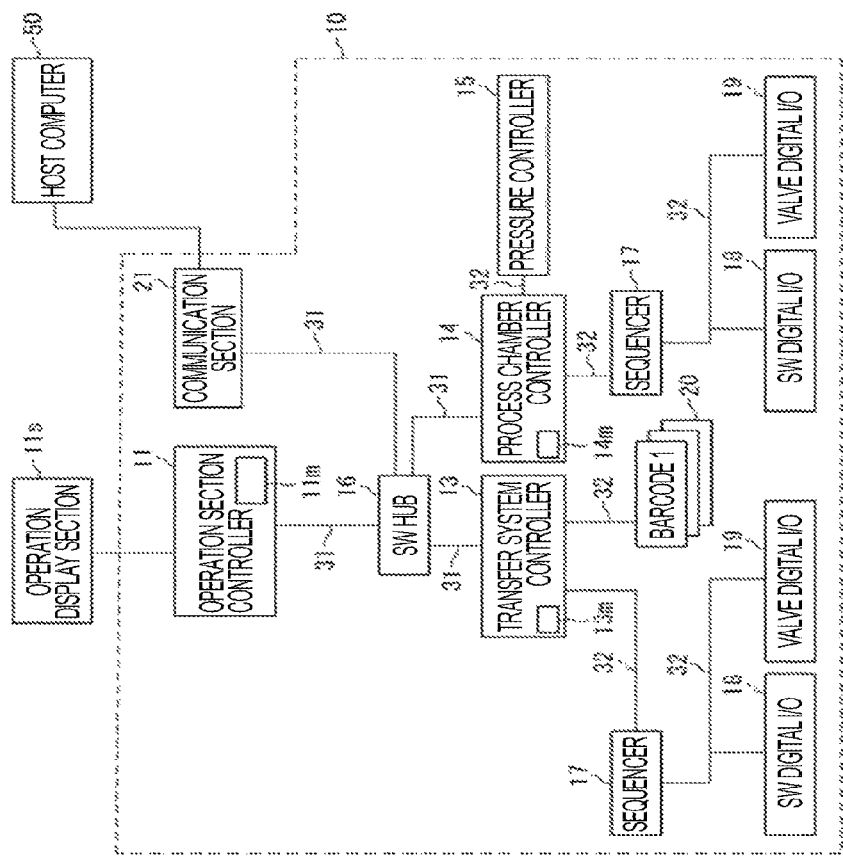
FIG. 2 is a configuration diagram of a control section of the substrate processing apparatus according to the embodiment of the present disclosure.

Next, a description will be made regarding the control section 10 serving as the apparatus controller that controls the substrate processing apparatus 100 mainly with respect to FIG. 2. FIG. 2 is a configuration diagram of the control section 10 of the substrate processing apparatus 100. As illustrated in FIG. 2, an operation section controller 11, the transfer system controller 13 and the process chamber controller 14 are provided so as to be connected with each other using a communication network 31 such as LAN via a switching hub 16 in the control section 10. In addition, a host computer (host) 50 is connected to the control section 10 using the communication network 31 such as the LAN.

The control section 10 is provided, for example, in the substrate processing apparatus 100, is configured to control each section of the substrate processing apparatus 100 by including the operation section controller 11, the transfer system controller 13, the process chamber controller 14 and the like. The operation section controller 11, the transfer system controller 13 and the process chamber controller 14 are provided with memory sections 11m, 13m and 14m, respectively, that store a CPU (Central Processing Unit) and an operation program of each controller or the like as a hardware configuration, and each CPU operates according to the respective operation programs. Each of the memory sections 11m, 13m and 14m is configured of an EEPROM, a flash memory, a hard disk and the like, and also includes a storage medium in which the operation program of the CPU described above is stored. The memory section of the substrate processing apparatus 100 including the respective memory sections 11m, 13m and 14m, and the like is collectively referred to as a memory section 30.

The control section 10, or the operation section controller 11, the transfer system controller 13 and the process chamber controller 14, may be configured as, for example, a general purpose computer such as a personal computer. In this case, it is possible to configure each of the controllers by installing a program to the general purpose computer using a computer-readable recording medium in which various programs are stored (a flexible disk, a CD-ROM, a USB memory, a magnetic tape, a hard disk, a DVD and the like).

In addition, it is possible to arbitrarily select a means for supplying a program that executes the above-described processing. It is possible to supply the program using, for example, a communication line, a communication network, a communication system and the like other than using a predetermined recording medium as described above.

The operation section controller 11 is an interface between the controller and an operator together with an operation display section 11s, which is connected to the operation section controller 11, and is configured to receive an operation and an instruction, by the operator via the operation display section 11s. An operation section is configured, mainly, of the operation section controller 11 and the operation display section 11s. Various operation screens and the information of various types of data and the like are displayed on the operation display section 11s. The data to be displayed on the operation display section 11s is stored in the memory section 11m of the operation section controller 11.

The valve digital I/O 19, which controls the supply of the process gas and the on/off of the exhaust valve, and the SW digital I/O 18, which controls the on/off of the various switches (SW) and the like, are connected to the process chamber controller 14 and the transfer system controller 13, respectively, using a signal line 32 such as DeviceNet via a sequencer 17. In addition, the process chamber controller 14 and the transfer system controller 13 are provided with the memory sections 14m and 13m, respectively, in which a process recipe representing a substrate processing procedure in the process chamber, a substrate transfer recipe representing a substrate transfer procedure, and the various programs are stored.

The process chamber controller 14 is configured to control the substrate processing in the process chambers PM1 and PM2. To be specific, the pressure controller 15 such as an auto pressure controller (APC) that controls each pressure in the process chambers PM1 and PM2 is connected to the process chamber controller 14, for example, using the signal line 32. For example, the process chamber controller 14 outputs control data (a control instruction) at the time of processing the wafer W based on the process recipe, that has been received from the host computer 50 and stored in the memory section 14m, with respect to the pressure controller 15, a supply and exhaust valve of the process gas, the various switches, the mass flow controller, the temperature adjuster and the like, and performs the control of the substrate processing in the process chambers PM1 and PM2. Incidentally, the process recipe can also be created or edited by the operator via the operation section controller 11.

The transfer system controller 13 includes the vacuum transfer robot VR and a robot controller that controls the atmospheric transfer robot AR, and is configured to perform the transfer control of the wafer W. A carrier ID memory section 20 in which barcodes 1, 2, 3 and so on, which indicate the carrier ID for identifying the pods FP1 to FP3 mounted to the load ports LP1 to LP3, and the like are stored is connected to the transfer system controller 13, for example, using the signal line 32. For example, the transfer system controller 13 outputs the control data (control instruction) at the time of transferring the wafer W based on the substrate transfer recipe, that has been received from the host computer 50 and stored in the memory section 13m, with respect to the vacuum transfer robot VR, the atmospheric transfer robot AR, the wafer aligner AU, the various valves, the switch and the like, and performs the transfer control of the wafer W in the substrate processing apparatus 100. Incidentally, the substrate transfer recipe can also be created or edited by the operator via the operation section controller 11.

According to the configuration described above, the control section 10 executes the process recipe stored in the memory section 14m of the process chamber controller 14 based on the instruction of the operator from the operation display section 11s, for example, and performs the control according to the process recipe such that the flow rate of the process gas to be supplied to the process chambers PM1 and PM2, the pressure in the process chambers PM1 and PM2, or the temperature of the wafer W in the process chambers PM1 and PM2 becomes a predetermined value. In addition, the control section 10 executes the substrate transfer recipe stored in the memory section 13m of the transfer system controller 13 using the atmospheric transfer robot AR and the vacuum transfer robot VR according to the above-described substrate transfer recipe when executing the process recipe as described above, and transfers the wafer W among the pods FP1 to FP3 on the load ports LP1 to LP3, the wafer aligner AU, the cooling chambers LM1 and LM2, and the process chambers PM1 and PM2. At this time, the transfer control of the wafer W is performed as the first example and the second example which will be described later.

(3) Substrate Processing Step

Next, a description will be made regarding substrate processing steps using the substrate processing apparatus 100 having the above-described configuration. The substrate processing steps are implemented as one step of semiconductor manufacturing steps of manufacturing, for example, the semiconductor device. In the substrate processing step, each constituent section of the substrate processing apparatus 100 is controlled by the control section 10. First, the vacuum side gate valves LGV1 and LGV2 at the vacuum transfer chamber TM side of the cooling chambers LM1 and LM2 are closed, and the atmosphere side gate valves LGA1 and LGA2 at the atmospheric transfer chamber EFEM side are opened so that each inside of the vacuum transfer chamber TM and the process chambers PM1 and PM2 is vacuum-exhausted. In parallel, the clean air is supplied into the atmospheric transfer chamber EFEM so that the inside of the atmospheric transfer chamber EFEM becomes the atmospheric pressure state.

Thereafter, when the pod FP1, for example, in which twenty-five unprocessed wafers are housed, has been transferred to the substrate processing apparatus 100 by an in-process transfer apparatus, as illustrated in FIG. 1, the pod FP1 that has been transferred is handed over from the in-process transfer apparatus and mounted onto, for example, the load port LP1. The pod FP1 mounted onto the load port LP1 is authenticated in a manner such that an ID (for example, the barcode) of the pod FP1 is read by an ID reading apparatus (not illustrated).

Subsequently, the control section 10 controls each section of the substrate processing apparatus 100, and starts the transfer of the wafer W according to the substrate transfer recipe. To be specific, as illustrated in FIG. 1, the atmospheric transfer robot AR transfers the wafer W at the head in the pod FP1, for example, from a predetermined slot in the pod FP1 into the atmospheric transfer chamber EFEM, and causes the wafer W to be mounted onto the wafer aligner AU. The wafer aligner AU moves the mounted wafer W in the horizontal and vertical directions and the circumferential direction in the horizontal plane, and adjusts the notch position of the wafer W. After the position adjustment of the wafer W by the wafer aligner AU ends, the atmospheric transfer robot AR picks up the wafer W on the wafer aligner AU.

Next, the atmosphere side gate valve LGA1 is opened, the atmospheric transfer robot AR loads the wafer W into the cooling chamber LM1 the atmospheric pressure state, and transfers the wafer W on the substrate holding stage LH1 in the cooling chamber LM1. During this transfer work, the vacuum side gate valve LGV1 at the vacuum transfer chamber TM side is closed, and the negative pressure in the vacuum transfer chamber TM is maintained.

When the transfer of the wafer W to the substrate holding stage LH1 is completed, the atmosphere side gate valve LGA1 is closed, and the inside of the cooling chamber LM1 is vacuum-exhausted to be a predetermined negative pressure by the exhaust apparatus (not illustrated).

During the time, the transfer of the wafer W into the cooling chamber LM2 is also simultaneously performed. That is, while the inside of the cooling chamber LM1 into which the wafer W is transferred is vacuum-exhausted to be the reduced pressure, for example, the wafer W in the pod FP1 is transferred into the cooling chamber LM2 in the same procedure as described above.

When the cooling chamber LM1 is pressure-reduced to the pressure value that has been set in advance, the vacuum side gate valve LGV1 is opened, and the vacuum transfer robot VR of the vacuum transfer chamber TM picks up the wafer W from the substrate holding stage LH1 and loads the wafer W into the vacuum transfer chamber TM. Then, the vacuum side gate valve LGV1 is closed, the cooling chamber LM1 is returned to the atmospheric pressure, and one subsequent wafer W is loaded into the cooling chamber LM1.

Thereafter, the process chamber gate valve PGV1 of the process chamber PM1 is opened, the vacuum transfer robot VR loads the picked up wafer W into the process chamber PM1, and causes the wafer W to be mounted onto the substrate mounting stage ST1. In this manner, the transfer of the wafer W in the cooling chambers LM1 and LM2 into the process chamber PM1 is repeated, and the plurality of wafers W is mounted onto the substrate mounting stage ST1 in the process chamber PM1. Thereafter, the process gas is supplied from a gas supply apparatus (not illustrated) into the process chamber PM1 after the process chamber gate valve PGV1 is closed, the wafer W is subjected to a desired processing under the negative pressure, for example, the substrate processing for forming the semiconductor device on the substrate. At this time, the same substrate processing or various types of substrate processing having different contents are simultaneously performed even in the process chamber PM2, in some cases.

After the substrate processing ends in the process chamber PM1, the process chamber gate valve PGV1 is opened, and the vacuum transfer robot VR unloads the wafer W from the process chamber PM1. After the wafer W is unloaded from the process chamber PM1, the process chamber gate valve PGV1 is closed. Next, when the vacuum side gate valve LGV1 is opened, the vacuum transfer robot VR loads the wafer W unloaded from the process chamber PM1 into the cooling chamber LM1, and causes the wafer W to be mounted onto the substrate holding stage LH1. Further, when the cooling chamber LM1 is filled with the wafers, the vacuum side gate valve LGV1 is closed, and the cooling of the processed wafer W is started in the cooling chamber LM1. At the same time, the inert gas is introduced from an inert gas supply apparatus (not illustrated) connected to the cooling chamber LM1, and the pressure in the cooling chamber LM1 is returned to the atmospheric pressure.

When a cooling processing time Ct that has been set in advance elapses, and further, the pressure in the cooling chamber LM1 is returned to the atmospheric pressure in the cooling chamber LM1, the atmosphere side gate valve LGA1 is opened. Subsequently, the atmospheric transfer robot AR picks up the processed wafer W from the substrate holding stage LH1 and unloads the wafer W to the atmospheric transfer chamber EFEM, and the atmospheric transfer robot AR houses the processed wafer W in the pod FP1. Thereafter, the atmosphere side gate valve LGA1 is closed.

When the entire wafer W in the pod FP1 is subjected to the desired processing via the substrate processing steps described above, and all the twenty-five processed wafers W are housed in the pod FP1, a cap of the pod FP1 is closed by the FOUP door FD1. The pod FP1 of which the cap is closed is transferred from a top of the load port LP1 to a subsequent step by the in-process transfer apparatus. By repeating the above-described operations, the wafers are sequentially processed every twenty-five wafers in unit of the pod.

In a case where the substrate processing in the process chamber PM2 is performed in parallel with the substrate processing in the process chamber PM1, for example, the wafer W in the pod FP2, which has been mounted onto the load port LP2, is transferred to the process chamber PM2 and processed in the same procedure as the wafer W in the pod FP1, and is returned to the pod FP2. The wafer W in the pod FP2 is transferred to the process chamber PM2 after the transfer of the wafer W of the number per one-time process (for example, five) in the pod FP1 to the process chamber PM1, or, is transferred to the process chamber PM2 in parallel to the transfer of the wafer W of the number per one-time process (for example, five) in the pod FP1 to the process chamber PM1. The same procedure is applied when the wafer W is returned to the pod FP2 after the processing.

(4) Substrate Transfer Control of Present Embodiment

Next, a description will be made regarding the substrate transfer control of the present embodiment. First, a description will be made regarding the memory section 30 that is configured of the memory section 13m of the transfer system controller 13, the memory section 14m of the process chamber controller 14 and the like. Each operation time of the atmospheric transfer robot AR, the vacuum transfer robot VR, the wafer aligner AU, the respective gate valves and the like is stored, as a hardware parameter, in a nonvolatile area, for example, of the memory section 13m of the transfer system controller 13. This hardware parameter can be set by the operator from the operation display section 11s.

To be specific, as the hardware parameter, stored are a time for which the atmospheric transfer robot AR transfers the substrate from the pods FP1 to FP3 on the load ports LP1 to LP3 to the wafer aligner AU, a time for which the substrate is transferred from the wafer aligner AU to the preliminary chambers (the cooling chambers) LM1 and LM2, a position adjustment time of the wafer aligner AU, a time for which the vacuum transfer robot VR transfers the substrate mutually between the preliminary chambers (the cooling chambers) LM1 and LM2, and the process chambers PM1 and PM2, an opening and closing time of the FOUP doors FD1 to FD3, an opening and closing time of the atmosphere side gate valves LGA1 and LGA2, an opening and closing time of the vacuum side gate valves LGV1 and LGV2, an opening and closing time of the process chamber gate valves PGV1 and PGV2, an evacuation time (reduced pressure time) LEt until the preliminary chambers (the cooling chambers) LM1 and LM2 reaches a predetermined negative pressure state from the atmospheric pressure state by the exhaust, an atmospheric pressure returning time until the preliminary chambers (the cooling chambers) LM1 and LM2 reaches the atmospheric pressure state from the predetermined negative pressure state by the introduction of the inert gas, the cooling processing time Ct in the preliminary chambers (the cooling chambers) LM1 and LM2, and the like.

First Example

Next, a description will be made regarding the first example for solving the first problem. In the first example, in a case where the substrate is in the middle of being processed in the process chamber PM, the transfer system controller 13 determines magnitude relation between a remaining time (recipe remaining time: RRt) of the substrate processing in the process chamber PM, and a time (approach time: LVt) until the wafer W is taken out from the pod FP on the load port LP and is mounted onto the arm of the vacuum transfer robot VR, and determines a timing at which the atmospheric transfer robot AR takes out the wafer W from the pod FP. For example, the recipe remaining time RRt is equal to or less than the approach time LVt, the transfer system controller 13 controls the atmospheric transfer robot AR, the respective gate valves, the vacuum transfer robot VR and the like so as to take out the wafer W from the pod FP on the load port LP, and mount the wafer W on the arm of the vacuum transfer robot VR.

To be specific, the transfer system controller 13 calculates, with reference to the hardware parameter, the approach time LVt until the wafer W is taken out from the pod FP on the load port LP, passes via the wafer aligner AU, and is mounted onto the arm of the vacuum transfer robot VR. In addition, the process chamber controller 14 constantly notifies the transfer system controller 13 of the recipe remaining time RRt while the substrate is processed in the process chamber PM.

Here, the approach time LVt includes the opening operation time of the FOUP door FD, a wafer transfer time from the FOUP door FD to the wafer aligner AU, a position adjustment operation time in the wafer aligner AU, the opening operation time of the atmosphere side gate valve LGA, a wafer transfer time from the wafer aligner AU to the preliminary chamber LM, the closing operation time of the atmosphere side gate valve LGA, the evacuation time LEt of the preliminary chamber LM, the opening operation time of the vacuum side gate valve LGV, a time for which the wafer is taken out from the preliminary chamber LM by the vacuum transfer robot VR, and the closing operation time of the vacuum side gate valve LGV. Incidentally, the recipe remaining time RRt may include the opening operation time of the process chamber gate valve PGV.

For example, when the transfer system controller 13 starts the substrate processing in a plurality of the process chambers (in the present embodiment, the process chambers PM1 and PM2), and thereafter, transfers the substrate from the pod FP2 on the load port LP2 to the process chamber PM2, the transfer system controller 13 determines the timing for the atmospheric transfer robot AR to take out the wafer W from the pod FP2 based on the recipe remaining time RRt in the process chamber PM2 and the approach time LVt until the wafer W is taken out from the pod FP2 on the load port LP2, and is mounted onto the arm of the vacuum transfer robot VR.

To be specific, when the recipe remaining time RRt in the process chamber PM2 is equal to or less than the approach time LVt, the transfer system controller 13 controls the atmospheric transfer robot AR, the respective gate valves and the like such that the atmospheric transfer robot AR takes out the wafer W from the pod FP2. At this time, in a case where the wafer W is not present in the pod FP2, the transfer of the processed substrate in the process chamber PM2 is preferentially performed. In short, when the recipe remaining time RRt becomes zero, each of the processed substrates in the process chamber PM2 is transferred to an original position in the pod FP2 by the vacuum transfer robot VR and the atmospheric transfer robot AR. Alternatively, when the recipe remaining time RRt in the process chamber PM1 becomes equal to or less than the approach time LVt until the wafer W is taken out from the pod FP1 on the load port LP1 and mounted onto the arm of the vacuum transfer robot VR, the transfer system controller 13 controls the atmospheric transfer robot AR, the respective gate valves and the like such that the atmospheric transfer robot AR takes out the wafer W from the pod FP1. Further, in a case where the wafer W is not present in the pod FP1 at this time, the transfer of the processed substrate in the process chamber PM1 is performed as similarly to the processed substrate in the process chamber PM2.

In this manner, a subsequent unprocessed wafer W (for example, the wafer B6 in FIG. 5) is mounted onto the arm of the vacuum transfer robot VR, for example, at a point of time at which the substrate processing in the process chamber PM2 ends, that is, a point of time at which the exchange with the processed wafer W (for example, the wafer B1 in FIG. 5) in the process chamber PM2 becomes possible. Accordingly, it is possible to increase maximally the free time of the vacuum transfer robot VR, that is, the time for which the wafer W is not mounted onto the arm of the vacuum transfer robot VR, and thus, it is possible to preferentially unload the processed wafer W (for example, the wafers A1 to A5 in FIG. 5) in the process chamber PM1 at the other side.

In this manner, it is possible to suppress the first problem, for example, that the processed wafers A1 to A5 of the group A in the process chamber PM1 are stagnated in the process chamber PM1 for the time until the wafers B1 to B25 of the group B are transferred to the process chamber PM2 as illustrated in FIG. 5.

Incidentally, in the first example, it is possible to provide a configuration in which a substrate transfer chamber provided with a substrate transfer robot R is provided between the process chambers PM1 and PM2, and the load port LP, instead of the configuration of FIG. 1, so that the substrate is transferred between the process chambers PM1 and PM2, and the pod FP on the load port LP. This substrate transfer chamber is set to an atmospheric pressure transfer chamber or a transfer chamber capable of switching of the negative pressure and the atmospheric pressure depending on the content of the substrate processing.

According to the first example described above, it is possible to obtain at least one of the following effects. (A1) It is possible to suppress the processed substrate from being stagnated in the process chamber PM1 as compared to a case where the configuration of the present disclosure is not provided since, when the substrate is transferred from the pod FP to the process chamber PM2 after the substrate processing is started in the process chambers PM1 and PM2, the timing for the atmospheric transfer robot AR to take out the substrate from the pod FP is determined based on the recipe remaining time in the process chamber PM2, and the approach time until the substrate is taken out from the pod FP and is mounted to the vacuum transfer robot VR. (A2) It is possible to more reliably suppress the processed substrate from being stagnated in the process chamber PM1 since, when the recipe remaining time in the process chamber PM2 becomes equal to or less than the approach time, the atmospheric transfer robot AR takes out the substrate from the pod FP. In addition, it is possible to suppress the substrate processing in the process chamber PM2 from being delayed while suppressing the processed substrate from being stagnated in the process chamber PM1. (A3) In addition, it is possible to more reliably suppress the processed substrate from being stagnated in the process chamber PM1 since, when the substrate is transferred from the pod FP to the process chamber PM2 after starting the substrate processing in the process chambers PM1 and PM2, the recipe remaining time in the process chamber PM1 and the process chamber PM2 and the approach time until the substrate is taken out from the pod FP and is mounted to the vacuum transfer robot VR are compared, and the transfer of the processed substrate in the process chamber PM1 is preferentially performed when the recipe remaining time in the process chamber PM1 is equal to or less than the approach time. (A4) It is possible to suitably calculate the approach time in the case of providing the preliminary chamber to be interposed since the approach time is configured to include, at least, the time for which the atmospheric transfer robot AR transfers the substrate from the pod FP to the preliminary chamber, the time until the preliminary chamber reaches the negative pressure state from the atmospheric pressure state, and the time for which the vacuum transfer robot VR takes out the substrate from the preliminary chamber.

Second Example

Figure 3:
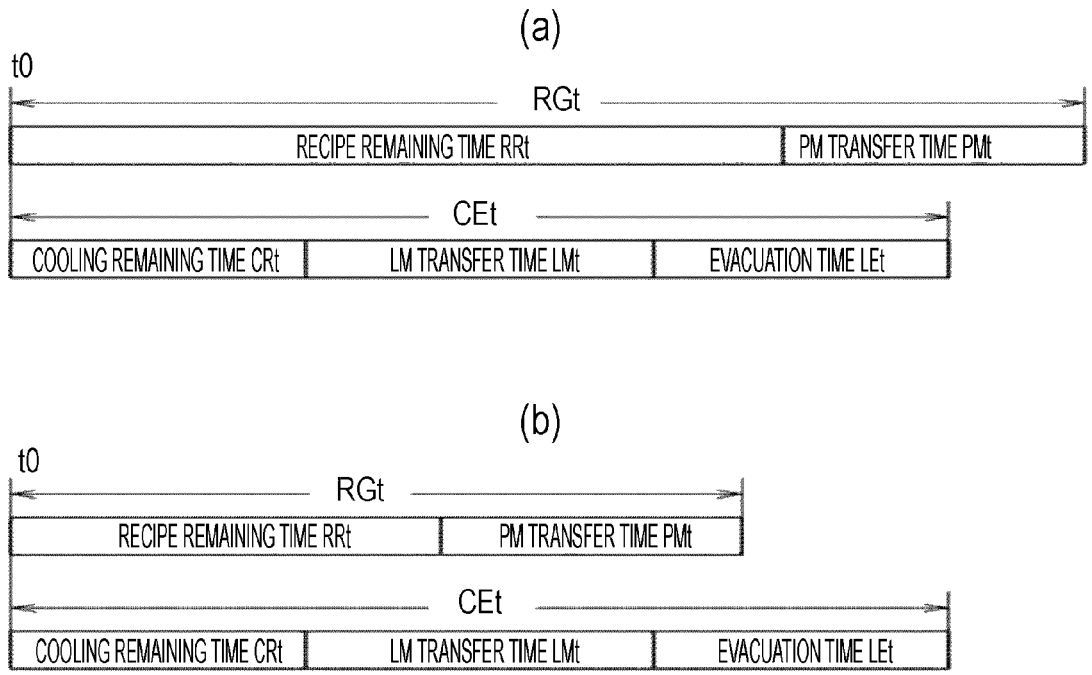
FIGS. 3(a) and 3(b) are diagrams for describing a second example according to the embodiment of the present disclosure.

Next, a description will be made regarding the second example for solving the second problem with reference to FIGS. 3(a) and 3(b). FIGS. 3(a) and 3(b) are diagrams for describing the second example according to the present embodiment. In FIGS. 3(a) and 3(b), reference numeral tO indicates a timing, for example, at which the unloading of the wafer is completed when the cooled wafer W is unloaded from the inside of the cooling chamber LM1 to the atmosphere side. The recipe remaining time RRt is a processing time for the stagnation substrate in the process chamber PM in the middle of the substrate processing, for example, the process chamber PM2. A PM transfer time (processed substrate unloading time) PMt is a time required for unloading the processed wafer W from the process chamber PM2. A cooling remaining time CRt is a remaining time until the cooling of the wafer W in the middle of being cooled in the cooling chamber LM1 ends. An LM transfer time (cooled substrate unloading time) LMt is a time for unloading the cooled wafer W from the cooling chamber LM1. The evacuation time LEt is a time required for setting the cooling chamber LM1 from the atmospheric pressure to the negative pressure. The PM transfer time PMt, the LM transfer time LMt and the evacuation time LEt are stored in the memory section 30 as the above-described hardware parameter.

The processing and unloading time RGt is, for example, a time until the substrate processing ends in the process chamber PM2, and the processed wafer W is unloaded from the process chamber PM2, and is a total value of the recipe remaining time RRt and the PM transfer time PMt. The PM transfer time PMt may include the opening operation time of the process chamber gate valve PGV. A cooling and evacuation time CEt is, for example, a time until the processed wafer W in the cooling chamber LM1 is cooled, and taken out to the atmosphere side, and thereafter, the inside of the cooling chamber LM1 is set to the negative pressure from the atmospheric pressure, and is a total value of the cooling remaining time CRt, the LM transfer time LMt and the evacuation time LEt. The LM transfer time LMt may include the opening and closing time of the atmosphere side gate valve LGA.

In the second example, when the processed wafer is unloaded from the process chamber PM in the atmospheric pressure state of the inside of the cooling chamber LM1 or LM2, the transfer system controller 13 controls the cooling chamber LM1 or LM2 to be the negative pressure from the atmospheric pressure based on the recipe remaining time RRt in the process chamber PM and the cooling remaining time CRt in the cooling chamber LM1 or LM2. To be specific, when the processed wafer is unloaded from the process chamber PM in the atmospheric pressure state of the inside of the cooling chamber LM1 or LM2, the transfer system controller 13 controls the cooling chamber LM1 or LM2 to be the negative pressure from the atmospheric pressure based on the processing and unloading time RGt (the total value of the recipe remaining time RRt and the PM transfer time PMt) and the cooling and evacuation time CEt (the total value of the cooling remaining time CRt, the LM transfer time LMt and the evacuation time LEt).

For example, as illustrated in FIG. 3(a), the transfer system controller 13 maintains the atmospheric pressure in the cooling chamber LM1 or LM2, and unloads the cooled wafer W from the inside of the cooling chamber LM1 or LM2 in a case where the processing and unloading time RGt is greater than the cooling and evacuation time CEt of the cooling chamber LM1 or LM2. In this case, since the processing and unloading time RGt is greater than the cooling and evacuation time CEt, it is possible to cool the processed wafer W in the cooling chamber LM1 and take out the wafer W to the atmosphere side, and thereafter, to set the inside of the cooling chamber LM1 to be the negative pressure from the atmospheric pressure, for example, while the substrate processing in the process chamber PM2 ends, and the processed wafer W is unloaded from the process chamber PM2. That is, it is possible to taking out the processed wafer W in the cooling chamber LM1 to the atmosphere side without delaying the unloading of the processed wafer W from the process chamber PM2.

In addition, as illustrated in FIG. 3(b), the transfer system controller 13 sets the inside of the cooling chamber LM1 or LM2 to be the negative pressure from the atmospheric pressure without unloading the cooled wafer W from the inside of the cooling chamber LM1 or LM2 in a case where the processing and unloading time RGt is equal to or less than the cooling and evacuation time CEt in the atmospheric pressure state of the inside of the cooling chamber LM1 or LM2. In this case, since the processing and unloading time RGt is equal to or less than the cooling and evacuation time CEt, it is difficult to cool the processed wafer W in the cooling chamber LM1 and take out the wafer W to the atmosphere side, and thereafter, to set the inside of the cooling chamber LM1 to be the negative pressure from the atmospheric pressure, for example, while the substrate processing in the process chamber PM2 ends, and the processed wafer W is unloaded from the process chamber PM2. That is, when the processed wafer W in the cooling chamber LM1 is taken out to the atmosphere side, the unloading of the processed wafer W from the process chamber PM2 is delayed so that a production efficiency of the substrate processing apparatus 100 deteriorates. Here, it is obvious that the same description is applied also to the process chamber PM1.

To be specific, the transfer system controller 13 calculates, with reference to the hardware parameter, the processing and unloading time RGt by adding the recipe remaining time RRt in the process chamber PM, and the PM transfer time PMt for which the processed wafer W is unloaded from the process chamber PM. As described above, the recipe remaining time RRt is notified to the transfer system controller 13 by the process chamber controller 14 every second in real time. In addition, the transfer system controller 13 calculates, with reference to the hardware parameter, the cooling and evacuation time CEt by adding the cooling remaining time CRt of the cooling chamber LM, the LM transfer time LMt for which the cooled wafer W is unloaded from the cooling chamber LM, and the evacuation time LEt of the cooling chamber LM. The cooling remaining time CRt is calculated by subtracting a time that has elapsed after the cooling start time point from the above-described cooling processing time Ct. The transfer system controller 13 monitors and acquires the cooling remaining time CRt every second in real time.

For example, when the processed wafer is unloaded from the process chamber PM2 after unloading the processed wafer from the process chamber PM1 in the atmospheric pressure state of the inside of the cooling chamber LM1, the transfer system controller 13 maintains the atmospheric pressure in the cooling chamber LM1 and unloads the cooled wafer W from the inside of the cooling chamber LM1 in a case where the processing and unloading time RGt until the substrate processing ends in the process chamber PM2, and the processed wafer W is unloaded is greater than the cooling and evacuation time CEt until the processed wafer W is cooled in the cooling chamber LM1, taken out to the atmosphere side, and then, the inside of the cooling chamber LM1 is set to the negative pressure from the atmospheric pressure. In addition, the transfer system controller 13 sets the inside of the cooling chamber LM1 to the negative pressure from the atmospheric pressure without unloading the cooled wafer W from the inside of the cooling chamber LM1 in a case where the processing and unloading time RGt is equal to or less than the cooling and evacuation time CEt.

Figure 4:
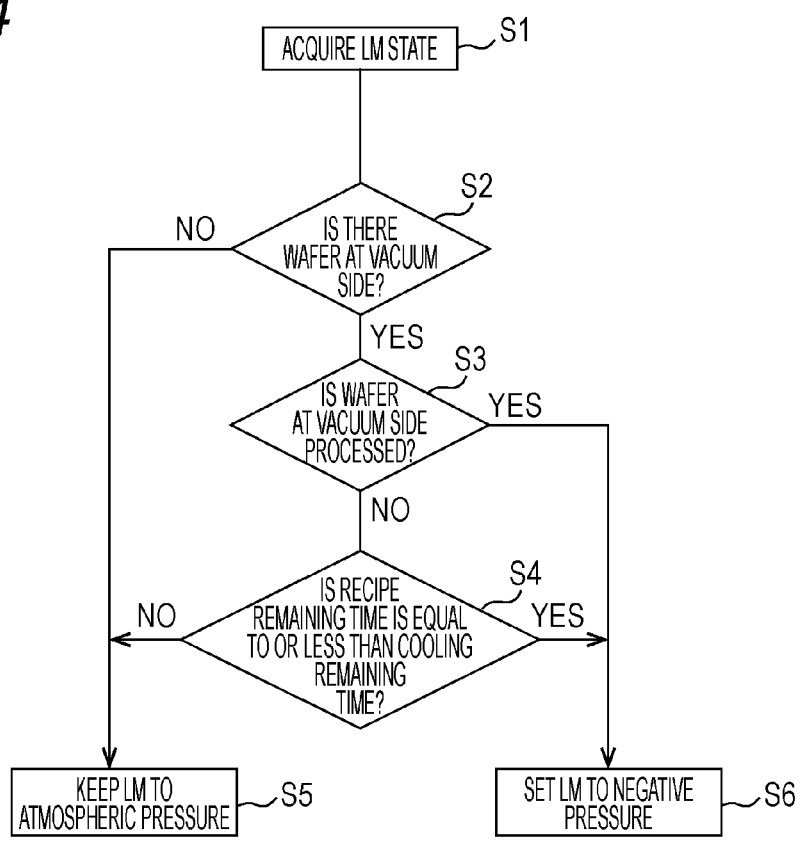
FIG. 4 is an operation flow diagram of the second example according to the embodiment of the present disclosure.

A description will be made regarding an operation of the transfer system controller 13 in the second example with reference to FIG. 4. FIG. 4 is an operation flow diagram of the second example of the present embodiment. First, the transfer system controller 13 checks and acquires a state of the cooling chamber LM1, for example, in the atmospheric pressure state of the inside of the cooling chamber LM1 (Step S1 in FIG. 4). Further, it is determined whether the wafer W is present at the vacuum side, that is, in the vacuum transfer chamber TM and the process chamber PM1 or PM2 (Step S2). In a case where the wafer W is not present at the vacuum side (No in Step S2), the inside of the cooling chamber LM1 is maintained to the atmospheric pressure (Step S5). In a case where the wafer W is present at the vacuum side (Yes in Step S2), it is determined whether the wafer W at the vacuum side is processed (Step S3). In a case where the wafer W at the vacuum side is processed (Yes in Step S3), the inside of the cooling chamber LM1 is set to the negative pressure (Step S6) to be prepared for loading of the processed wafer W from the process chamber PM1 or PM2 to the inside of the cooling chamber LM1.

In a case where the wafer W at the vacuum side is not processed (No in Step S3), it is determined whether the recipe remaining time RRt is equal to or less than the cooling remaining time CRt (Step S4). To be specific, it is determined whether the processing and unloading time RGt, which is the total time of the recipe remaining time RRt and the PM transfer time PMt for which the wafer W is unloaded from the PM, is equal to or less than the cooling and evacuation time CEt, which is the total time of the cooling remaining time CRt, the LM transfer time LMt for which the wafer W is unloaded from the LM, and the evacuation time LEt. Incidentally, it may be configured such that it is determined whether the recipe remaining time RRt is equal to or less than the cooling remaining time CRt by ignoring the PM transfer time PMt, the LM transfer time LMt and the evacuation time LEt. Even in such a manner, it is possible to suppress the processed substrate from being stagnated in the cooling chamber.

Further, in a case where the processing and unloading time RGt is equal to or less than the cooling and evacuation time CEt (Yes in Step S4), the inside of the cooling chamber LM1 is set to the negative pressure (Step S6) so as to be prepared for the unloading of processed wafer W from the process chamber PM1 or PM2 to the inside of the cooling chamber LM1. In addition, in a case where the processing and unloading time RGt is not equal to or less than the cooling and evacuation time CEt (No in Step S4), the inside of the cooling chamber LM1 is maintained to the atmospheric pressure (Step S5) so as to enable the unloading of the processed wafer W in the cooling chamber LM1.

In this manner, since the inside of the cooling chamber LM1 is maintained to the atmospheric pressure in a case where the processing and unloading time RGt is greater than the cooling and evacuation time CEt, it is possible to unload the processed wafer W (for example, the wafer A5 in FIG. 6) in the cooling chamber LM1 without causing the stagnation thereof. In addition, since the inside of the cooling chamber LM1 is set to the negative pressure in a case where the processing and unloading time RGt is equal to or less than the cooling and evacuation time CEt, it is possible to unload the processed wafer W from the process chamber PM1 or PM2 to the cooling chamber LM1 without causing the waiting thereof. In this manner, it is possible to suppress the delay in the unloading (waiting for unloading) of the processed wafer W from the process chamber PM1 or PM2 to the cooling chamber LM1, and thus, it is possible to reduce the entire processing time of the substrate processing apparatus 100.

According to the second example described above, it is possible to obtain at least one of the following effects. (B1) It is possible to suppress the processed substrate from the process chamber PM1 from being kept stagnated unnecessarily in the cooling chamber since the cooling chamber is set to the negative pressure from the atmospheric pressure based on the recipe remaining time in the process chamber PM2 and the cooling remaining time in the cooling chamber when the processed substrate is unloaded from the process chamber PM2 after the substrate processing is performed in the process chambers PM1 and PM2, and the processed substrate is unloaded from the process chamber PM1. Accordingly, it is possible to suppress the deterioration in the throughput. (B2) It is possible to reliably suppress the processed substrate from the process chamber PM1 from being stagnated in the cooling chamber since the cooling chamber is set to the negative pressure from the atmospheric pressure when the recipe remaining time is equal to or less than the cooling remaining time. In addition, it is possible to suppress generation of the delay in the unloading of the processed substrate from the process chamber PM2 while suppressing the processed substrate from being stagnated in the cooling chamber. (B3) It is possible to suppress the generation of the delay in the unloading of the processed substrate from the process chamber PM2 while suppressing the processed substrate from the process chamber PM1 from being stagnated in the cooling chamber more suitably, because, when the processed substrate is unloaded from the process chamber PM2 after the substrate processing is performed in the process chambers PM1 and PM2, and the processed substrate is unloaded from the process chamber PM1, the cooling chamber is enable to be set to the negative pressure from the atmospheric pressure based on the processing and unloading time, which is the total time of the recipe remaining time in the process chamber PM2, and the substrate unloading time for which the processed substrate is unloaded from the process chamber PM2, and the cooling and evacuation time, which is the total time of the cooling remaining time in the cooling chamber, the cooled substrate unloading time for which the cooled substrate is unloaded from the cooling chamber, and the evacuation time required for setting the cooling chamber to be the negative pressure from the atmospheric pressure. (B4) In addition, it is possible to suppress the processed substrate from the process chamber PM1 and the processed substrate from the process chamber PM2 from being present in the same cooling chamber. In this manner, it is possible to avoid the risk of deterioration in the process quality even if the process chamber PM1 and the process chamber PM2 perform different types of the substrate processing.

It is obvious that the present disclosure is not limited to the above-described embodiment, and can be modified into various types in a range not departing from a gist thereof. In the above-described embodiment, the description has been made regarding a case where the number of the load ports is three, the number of the preliminary chambers (the cooling chambers) is two, the number of the process chambers is two, and the five substrates are mounted in the process chamber, but the present disclosure is not limited to these numbers. In addition, in the above-described embodiment, it is configured such that the wafer of the pod FP1 is processed in the process chamber PM1, and the wafer of the pod FP2 is processed in the process chamber PM2, but the present disclosure is not limited thereto. That is, it is also possible to process the wafer of the pod FP2 in the process chamber PM1, and it is also possible to process the wafers of the pod FP1 and the pod FP2 in the process chamber PM1. In addition, it may be configured to implement any one of the first example and the second example, or to implement both the examples. In a case where only the first example is implemented, the chamber serving as both the preliminary chamber and the cooling chamber LM is not necessarily provided with a cooling function, and functions as the preliminary chamber LM in such a case.

The present disclosure can be applied not only to the semiconductor manufacturing apparatus, but also to an apparatus of processing a glass substrate such as an LCD manufacturing apparatus, or other substrate processing apparatuses. The processing content of the substrate processing may be not only the film deposition process of forming CVD, PVD, ALD, an epitaxial growth film, an oxide film, a nitride film, a metal-containing film or the like, but also an annealing process, an oxidation process, a diffusion process, an etching process, an exposure process, lithography, a coating process, a mold process, a development process, a dicing process, a wire bonding process, an inspection process and the like.

Preferred Embodiment of Present Disclosure

Hereinafter, preferred embodiments of the present disclosure will be appended.
Supplementary Note 1
According to an aspect of the present disclosure, there is provided a substrate processing apparatus, including: a plurality of process chambers that process a substrate; a mounting section on which one or more housing vessels that house the substrate is mounted; a vacuum transfer chamber that has a vacuum transfer machine to transfer the substrate under a negative pressure; an atmospheric transfer chamber that has an atmospheric transfer machine to transfer the substrate under an atmospheric pressure; and a control section that determines a timing for the atmospheric transfer machine to take out the substrate from the housing vessel based on a recipe remaining time, which is a remaining time of substrate processing in each of the plurality of process chambers, and an approach time, which is a time from when the substrate is taken out from the housing vessel till when the substrate is mounted to the vacuum transfer machine, when the substrate is transferred from the housing vessel to a predetermined process chamber among the process chambers after the substrate is transferred to the plurality of process chambers from the housing vessel mounted to the mounting section via the atmospheric transfer chamber and the vacuum transfer chamber and the substrate processing is started in the plurality of process chambers.
Supplementary Note 2
Preferably, the substrate processing apparatus of Supplementary note 1 may further include: a cooling chamber that is capable of switching a negative pressure state and an atmospheric pressure state, and cools a processed substrate transferred from the plurality of process chambers, wherein the control section controls the cooling chamber to be the negative pressure from the atmospheric pressure based on a recipe remaining time, which is a remaining time of substrate processing in the process chamber other than the predetermined process chamber, and a cooling remaining time, which is a remaining time of substrate cooling in the cooling chamber, when the processed substrate is unloaded from the process chamber other than the predetermined process chamber after the processed substrate is unloaded from the predetermined process chamber.
Supplementary Note 3
Further, preferably, in the substrate processing apparatus of Supplementary note 1 or Supplementary note 2, the control section delays a timing for the atmospheric transfer machine to take out an unprocessed substrate from the substrate housing vessel when the processed substrate is unloaded from the predetermined process chamber, until the unloading of the processed substrate ends.

Supplementary Note 4

Further, preferably, in the substrate processing apparatus of Supplementary note 1, the control section controls the atmospheric transfer machine to take out the substrate from the housing vessel when the recipe remaining time is equal to or less than the approach time.

Supplementary Note 5

Further, preferably, in the substrate processing apparatus of Supplementary note 2, the control section controls the cooling chamber to be the negative pressure from the atmospheric pressure when the recipe remaining time is equal to or less than the cooling remaining time.

Supplementary Note 6

Further, preferably, in the substrate processing apparatus of Supplementary note 2, the control section controls the cooling chamber to be the negative pressure from the atmospheric pressure based on a processing and unloading time, which is a total time of the recipe remaining time and a processed substrate unloading time as a time required for unloading the processed substrate from the predetermined process chamber, and a cooling and evacuation time, which is a total time of the cooling remaining time, a cooled substrate unloading time as a time required for unloading a cooled substrate from the cooling chamber, and an evacuation time as a time required for setting the cooling chamber to be the negative pressure from the atmospheric pressure.

Supplementary Note 7

Further, preferably, in the substrate processing apparatus of Supplementary note 6, the control section controls the cooling chamber to be the negative pressure from the atmospheric pressure when the processing and unloading time is equal to or less than the cooling and evacuation time.

Supplementary Note 8

According to another aspect of the present disclosure, there is provided a non-transitory computer-readable recording medium that stores a program to be executed by a substrate processing apparatus, the substrate processing apparatus including: a plurality of process chambers that process a substrate; a vacuum transfer chamber that has a vacuum transfer machine to transfer the substrate under a negative pressure; an atmospheric transfer chamber that has an atmospheric transfer machine to transfer the substrate under an atmospheric pressure; and a control section that transfers the substrate to the process chamber via the atmospheric transfer chamber and the vacuum transfer chamber, the program causing the control section to execute a timing determination step of determining a timing for the atmospheric transfer machine to take out the substrate from the housing vessel based on a recipe remaining time, which is a remaining time of substrate processing in a predetermined process chambers, and an approach time, which is a time until the substrate is mounted to the vacuum transfer machine when the substrate is transferred to the predetermined process chamber after the substrate processing is started in the plurality of process chambers.

Supplementary Note 9

Preferably, in the non-transitory computer-readable recording medium in which the program to be executed by the substrate processing apparatus of Supplementary note 8, the substrate processing apparatus further including a cooling chamber that cools a processed substrate transferred from the process chamber, the program causing the control section to execute: a cooling chamber reduced pressure step of setting the cooling chamber to be the negative pressure from the atmospheric pressure based on a recipe remaining time, which is a remaining time of substrate processing in the process chamber other than the predetermined process chamber, and a cooling remaining time, which is a remaining time of substrate cooling in the cooling chamber, when the processed substrate is unloaded from the process chamber other than the predetermined process chamber after unloading the processed substrate from the predetermined process chamber; and a substrate cooling step of cooling the processed substrate unloaded from the plurality of process chambers in the cooling chamber.

Supplementary Note 10

According to still another aspect of the present disclosure, there is provided a method of manufacturing semiconductor device, the method including: a substrate transfer step of transferring a substrate via an atmospheric transfer chamber to which the substrate is transferred under an atmospheric pressure, and a vacuum transfer chamber to which the substrate is transferred under a negative pressure; a substrate processing step of performing a predetermined processing to the substrate in the plurality of process chambers; and a timing determination step of determining a timing for the atmospheric transfer machine to transfer the substrate based on a recipe remaining time, which is a remaining time of substrate processing in each of the plurality of process chambers, and an approach time, which is a time until the substrate is mounted to the vacuum transfer machine when the substrate is transferred to a predetermined process chamber among the plurality of process chambers after starting the substrate processing in the plurality of process chambers.

Supplementary Note 11

Preferably, in the method of Supplementary note 10 further including: a cooling chamber reduced pressure step of setting the cooling chamber to be the negative pressure from the atmospheric pressure based on a recipe remaining time, which is a remaining time of substrate processing in the process chamber other than the predetermined process chamber among the plurality of process chambers, and a cooling remaining time, which is a remaining time of substrate cooling in the cooling chamber, when the processed substrate is unloaded from the process chamber other than the predetermined process chamber among the plurality of process chambers after unloading the processed substrate from the predetermined process chamber; and a substrate cooling step of cooling the processed substrate unloaded from the plurality of process chambers.

Supplementary Note 12

According to still another aspect of the present disclosure, there is provided a substrate processing apparatus, including: first and second process chambers that process a substrate; a mounting section on which one or more housing vessels that house the substrate is mounted; a vacuum transfer chamber that has a vacuum transfer machine to transfer the substrate under a negative pressure; an atmospheric transfer chamber that has an atmospheric transfer machine to transfer the substrate under an atmospheric pressure; and a control section that determines a timing for the atmospheric transfer machine to take out the substrate from the housing vessel based on a recipe remaining time, which is a remaining time of the substrate processing in each of the first and second process chambers, and an approach time, which is a time from when the substrate is taken out from the housing vessel till when the substrate is mounted to the vacuum transfer machine, when the substrate is transferred to a predetermined process chamber between the first and second process chambers from the housing vessel after the substrate is transferred from the housing vessel mounted to the mounting section to the first and second process chambers via the atmospheric transfer chamber and the vacuum transfer chamber, substrate processing is started in the first and second process chambers.

Supplementary Note 13

Preferably, in the substrate processing apparatus of Supplementary note 12, wherein the control section controls the atmospheric transfer machine to take out the substrate from the housing vessel when the recipe remaining time is equal to or less than the approach time.

Supplementary Note 14

Preferably, in the substrate processing apparatus of Supplementary note 12 or Supplementary note 13, wherein the approach time includes a time for which the atmospheric transfer machine transfers the substrate from the housing vessel to the preliminary chamber, a time until the preliminary chamber reaches a negative pressure state from an atmospheric pressure state, and a time until the substrate in the preliminary chamber is mounted to the vacuum transfer machine.

Supplementary Note 15

According to another aspect of the present disclosure, there is provided a of manufacturing semiconductor device, the method, including: a substrate transfer step of transferring a substrate to first and second process chambers, which are adjacent to a vacuum transfer chamber and process the substrate under a negative pressure, from one or more housing vessels that house the substrate via an atmospheric transfer chamber that is adjacent to the housing vessel, and has an atmospheric transfer machine to transfer the substrate under an atmospheric pressure, a preliminary chamber that is adjacent to the atmospheric pressure transfer chamber, and is capable of switching a negative pressure state and an atmospheric pressure state, and the vacuum transfer chamber that is adjacent to the preliminary chamber and has a vacuum transfer machine to transfer the substrate under the negative pressure; a substrate processing step of performing substrate processing for forming a semiconductor device on the substrate under the negative pressure in the first and second process chambers; and a timing determination step of determining a timing for the atmospheric transfer machine to take out the substrate from the housing vessel based on a recipe remaining time, which is a remaining time of the substrate processing in the second process chamber, and an approach time, which is a time from when the substrate is taken out from the housing vessel till when the substrate is mounted to the vacuum transfer machine, when the substrate is transferred to the second process chamber from the housing vessel after starting the substrate processing in the first and second process chambers.

Supplementary Note 16

According to still another aspect of the present disclosure, there is provided a substrate transfer method, including: an unprocessed substrate transfer step of transferring an unprocessed substrate to first and second process chambers, which are adjacent to a vacuum transfer chamber and process a substrate under a negative pressure, from one or more housing vessels that house the substrate via an atmospheric transfer chamber that is adjacent to the housing vessel and has an atmospheric transfer machine to transfer the substrate under an atmospheric pressure, a preliminary chamber that is adjacent to the atmospheric pressure transfer chamber, and is capable of switching a negative pressure state and an atmospheric pressure state, and the vacuum transfer chamber that is adjacent to the preliminary chamber and has a vacuum transfer machine to transfer the substrate under the negative pressure; and a timing determination step of determining a timing for the atmospheric transfer machine to take out the substrate from the housing vessel based on a recipe remaining time, which is a remaining time of substrate processing in the second process chamber, and an approach time, which is a time from when the substrate is taken out from the housing vessel till when the substrate is mounted to the vacuum transfer machine, when the substrate is transferred to the second process chamber from the housing vessel after starting the substrate processing in the first and second process chambers in the unprocessed substrate transfer step.

Supplementary Note 17

According to still another aspect of the present disclosure, there is provided a program or a non-transitory computer-readable recording medium in which the program is stored, the program including: a substrate transfer step of transferring a substrate to first and second process chambers, which are adjacent to a vacuum transfer chamber and process the substrate under a negative pressure, from one or more housing vessels that house the substrate via an atmospheric transfer chamber that is adjacent to the housing vessel and has an atmospheric transfer machine to transfer the substrate under an atmospheric prepress, a preliminary chamber that is adjacent to the atmospheric pressure transfer chamber, and is capable of switching a negative pressure state and an atmospheric pressure state, and the vacuum transfer chamber that is adjacent to the preliminary chamber and has a vacuum transfer machine to transfer the substrate under the negative pressure; a substrate processing step of performing substrate processing for forming a semiconductor device on the substrate under the negative pressure in the first and second process chambers; and a timing determination step of determining a timing for the atmospheric transfer machine to take out the substrate from the housing vessel based on a recipe remaining time, which is a remaining time of the substrate processing in the second process chamber, and an approach time, which is a time from when the substrate is taken out from the housing vessel till when the substrate is mounted to the vacuum transfer machine, when the substrate is transferred to the second process chamber from the housing vessel after starting the substrate processing in the first and second process chambers.

Supplementary Note 18

According to still another aspect of the present disclosure, there is provided a substrate processing apparatus, including: first and second process chambers that process a substrate under a negative pressure; one or more housing vessels that house the substrate; a vacuum transfer chamber that is adjacent to the first and second process chambers and has a vacuum transfer machine to transfer the substrate under a negative pressure; and an atmospheric transfer chamber that is adjacent to the housing vessel and has an atmospheric transfer machine to transfer the substrate under an atmospheric pressure; and a cooling chamber that is adjacent to the vacuum transfer chamber and the atmospheric transfer chamber, is capable of switching a negative pressure state and an atmospheric pressure state and cools a processed substrate transferred from the first and second process chambers; and a control section that controls the cooling chamber to be the negative pressure from atmospheric pressure based on a recipe remaining time, which is a remaining time of substrate processing in the second process chamber, and a cooling remaining time, which is a remaining time of substrate cooling in the cooling chamber, when the substrate is transferred from the housing vessel to the first and second process chambers via the atmospheric transfer chamber, the cooling chamber and the vacuum transfer chamber, the substrate processing is started in the first and second process chambers, and thereafter, the processed substrate is unloaded from the second process chamber after unloading the processed substrate from the first process chamber.

Supplementary Note 19

Preferably, according to the substrate processing apparatus of Supplementary note 18, wherein the control section controls the cooling chamber to be the negative pressure from the atmospheric pressure when the recipe remaining time is equal to or less than the cooling remaining time.

Supplementary Note 20

Preferably, according to the substrate processing apparatus of Supplementary note 18, wherein the control section controls the cooling chamber to be the negative pressure from the atmospheric pressure based on a processing and unloading time, which is a total time of the recipe remaining time and a processed substrate unloading time as a time required for unloading the processed substrate from the second process chamber, and a cooling and evacuation time, which is a total time of the cooling remaining time, a cooled substrate unloading time as a time required for unloading a cooled substrate from the cooling chamber, and an evacuation time as a time required for the cooling chamber to be the negative pressure from the atmospheric pressure.

Supplementary Note 21

Preferably, according to the substrate processing apparatus of Supplementary note 20, wherein the control section controls the cooling chamber to be the negative pressure from the atmospheric pressure when the processing and unloading time is equal to or less than the cooling and evacuation time.

Supplementary Note 22

According to still another aspect of the present disclosure, there is provided a method of manufacturing semiconductor device, the method including: a substrate transfer step of transferring a substrate to first and second process chambers, which are adjacent to a vacuum process chamber and process a substrate under a negative pressure, from one or more housing vessels that house the substrate via an atmospheric transfer chamber that is adjacent to the housing vessel and has an atmospheric transfer machine to transfer the substrate under an atmospheric pressure, a cooling chamber that is adjacent to the atmospheric pressure transfer chamber, is capable of switching a negative pressure state and an atmospheric pressure state and cools a processed substrate transferred from the first and second process chambers, and the vacuum transfer chamber that is adjacent to the cooling chamber and has a vacuum transfer machine to transfer the substrate under the negative pressure; a substrate processing step of performing substrate processing for forming a semiconductor device on the substrate under the negative pressure in the first and second process chambers; a cooling chamber reduced pressure step of setting the cooling chamber to be the negative pressure from the atmospheric pressure based on a recipe remaining time, which is a remaining time of the substrate processing in the second process chamber, and a cooling remaining time, which is a remaining time of substrate cooling in the cooling chamber, when the processed substrate is unloaded from the second process chamber after unloading the processed substrate from the first process chamber; and a substrate cooling step of cooling the processed substrate unloaded from the first and second process chambers in the cooling chamber.

Supplementary Note 23

According to still another aspect of the present disclosure, there is provided a substrate transfer method, including: an unprocessed substrate transfer step of transferring an unprocessed substrate to first and second process chambers, which are adjacent to a vacuum transfer chamber, and process a substrate under a negative pressure, from one or more housing vessels that house the substrate via an atmospheric transfer chamber that is adjacent to the housing vessel and has an atmospheric transfer machine to transfer the substrate under an atmospheric pressure, a cooling chamber that is adjacent to the atmospheric pressure transfer chamber, is capable of switching a negative pressure state and an atmospheric pressure state and cools a processed substrate transferred from the first and second process chamber, and the vacuum transfer chamber that is adjacent to the cooling chamber and has a vacuum transfer machine to transfer the substrate under the negative pressure; a processed substrate transfer step of transferring the processed substrate from the first and second process chambers to the cooling chamber via the vacuum transfer chamber; a cooled substrate transfer step of transferring a cooled substrate from the cooling chamber to the housing vessel via the atmospheric pressure transfer chamber; and a cooling chamber reduced pressure step of setting the cooling chamber to be the negative pressure from the atmospheric pressure based on a recipe remaining time, which is a remaining time of substrate processing in the second process chamber, and a cooling remaining time, which is a remaining time of substrate cooling in the cooling chamber, when the processed substrate is unloaded from the second process chamber after unloading the processed substrate from the first process chamber in the processed substrate transfer step.

Supplementary Note 24

According to still another aspect of the present disclosure, there is provided a program or a non-transitory computer-readable recording medium in which the program is stored, the program including: a substrate transfer step of transferring a substrate to first and second process chambers, which are adjacent to a vacuum process chamber and process a substrate under a negative pressure, from one or more housing vessels that house the substrate via an atmospheric transfer chamber that is adjacent to the housing vessel and has an atmospheric transfer machine to transfer the substrate under an atmospheric pressure, a cooling chamber that is adjacent to the atmospheric pressure transfer chamber, is capable of switching a negative pressure state and an atmospheric pressure state and cools a processed substrate transferred from the first and second process chambers, and the vacuum transfer chamber that is adjacent to the cooling chamber and has a vacuum transfer machine to transfer the substrate under the negative pressure; a substrate processing step of performing substrate processing for forming a semiconductor device on the substrate under the negative pressure in the first and second process chambers; a cooling chamber reduced pressure step of setting the cooling chamber to be the negative pressure from the atmospheric pressure based on a recipe remaining time, which is a remaining time of the substrate processing in the second process chamber, and a cooling remaining time, which is a remaining time of substrate cooling in the cooling chamber, when the processed substrate is unloaded from the second process chamber after unloading the processed substrate from the first process chamber; and a substrate cooling step of cooling the processed substrate unloaded from the first and second process chambers in the cooling chamber.

Supplementary Note 25

According to still another aspect of the present disclosure, there is provided a substrate processing apparatus, including: first and second process chambers that process a substrate under a negative pressure; one or more housing vessels that house the substrate; a vacuum transfer chamber that is adjacent to the first and second process chambers and has a vacuum transfer machine to transfer the substrate under a negative pressure; an atmospheric transfer chamber that is adjacent to the housing vessel and has an atmospheric transfer machine to transfer the substrate under an atmospheric pressure; a cooling chamber that is adjacent to the vacuum transfer chamber and the atmospheric transfer chamber, is capable of switching a negative pressure state and an atmospheric pressure state and cools a processed substrate transferred from the first and second chamber; and a control section that determines a timing for the atmospheric transfer machine to take out the substrate from the housing vessel based on a recipe remaining time, which is a remaining time of substrate processing in the second process chamber, and an approach time, which is a time from when the substrate is taken out from the housing vessel till when the substrate is mounted to the vacuum transfer machine, when the substrate is transferred from the housing vessel to the first and second process chambers via the atmospheric transfer chamber, the cooling chamber and the vacuum transfer chamber, the substrate processing is started in the first and second process chambers, and thereafter, the substrate is transferred from the housing vessel to the second process chamber, and further controls the cooling chamber to be the negative pressure from the atmospheric pressure based on the recipe remaining time and a cooling remaining time, which is a remaining time of substrate cooling in the cooling chamber, when the processed substrate is unloaded from the second process chamber after unloading the processed substrate from the first process chamber.

Supplementary Note 26

According to still another aspect of the present disclosure, there is provided a method of manufacturing semiconductor device, the method including: a substrate transfer step of transferring a substrate to first and second process chambers, which are adjacent to a vacuum process chamber and process a substrate under a negative pressure, from one or more housing vessels that house the substrate via an atmospheric transfer chamber that is adjacent to the housing vessel and has an atmospheric transfer machine to transfer the substrate under an atmospheric pressure, a cooling chamber that is adjacent to the atmospheric pressure transfer chamber, is capable of switching a negative pressure state and an atmospheric pressure state and cools a processed substrate transferred from the first and second process chambers, and the vacuum transfer chamber that is adjacent to the cooling chamber and has a vacuum transfer machine to transfer the substrate under the negative pressure; a substrate processing step of performing substrate processing for forming a semiconductor device on the substrate under the negative pressure in the first and second process chambers; a substrate cooling step of cooling the processed substrate unloaded from the first and second process chambers in the cooling chamber; a timing determination step of determining a timing for the atmospheric transfer machine to take out the substrate from the housing vessel based on a recipe remaining time, which is a remaining time of the substrate processing in the second process chamber, and an approach time, which is a time from when the substrate is taken out from the housing vessel till when the substrate is mounted to the vacuum transfer machine, when the substrate is transferred to the second process chamber from the housing vessel after starting the substrate processing in the first and second process chambers; a cooling chamber reduced pressure step of setting the cooling chamber to be the negative pressure from the atmospheric pressure based on the recipe remaining time and a cooling remaining time, which is a remaining time of substrate cooling in the cooling chamber, when the processed substrate is unloaded from the second process chamber after unloading the processed substrate from the first process chamber.

Supplementary Note 27

According to still another aspect of the present disclosure, there is provided a substrate transfer method, including: an unprocessed substrate transfer step of transferring an unprocessed substrate to first and second process chambers, which are adjacent to a vacuum transfer chamber and process a substrate under a negative pressure, from one or more housing vessels that house the substrate via an atmospheric transfer chamber that is adjacent to the housing vessel and has an atmospheric transfer machine to transfer the substrate under an atmospheric pressure, a cooling chamber that is adjacent to the atmospheric pressure transfer chamber, is capable of switching a negative pressure state and an atmospheric pressure state and cools a processed substrate transferred from the first and second process chambers, and the vacuum transfer chamber that is adjacent to the cooling chamber and has a vacuum transfer machine to transfer the substrate under the negative pressure; a processed substrate transfer step of transferring a processed substrate from the first and second process chambers to the cooling chamber via the vacuum transfer chamber; a cooled substrate transfer step of transferring a cooled substrate from the cooling chamber to the housing vessel via the atmospheric pressure transfer chamber; a timing determination step of determining a timing for the atmospheric transfer machine to take out the unprocessed substrate from the housing vessel based on a recipe remaining time, which is a remaining time of substrate processing, and an approach time, which is a time from when the substrate is taken out from the housing vessel till when the substrate is mounted to the vacuum transfer machine, in the second process chamber, when the unprocessed substrate is transferred from the housing vessel to the second process chamber after starting the substrate processing in the first and second process chambers in the unprocessed substrate transfer step; and a cooling chamber reduced pressure step of setting the cooling chamber to be the negative pressure from the atmospheric pressure based on the recipe remaining time and a cooling remaining time, which is a remaining time of substrate cooling in the cooling chamber, when the processed substrate is unloaded from the second process chamber after unloading the processed substrate from the first process chamber in the processed substrate transfer step.

Supplementary Note 28

According to still another aspect of the present disclosure, there is provided a program or a non-transitory computer-readable recording medium in which the program is stored, the program including: a substrate transfer step of transferring a substrate to first and second process chambers, which are adjacent to a vacuum process chamber and process a substrate under a negative pressure, from one or more housing vessels that house the substrate via an atmospheric transfer chamber that is adjacent to the housing vessel and has an atmospheric transfer machine to transfer the substrate under an atmospheric pressure, a cooling chamber that is adjacent to the atmospheric pressure transfer chamber, is capable of switching a negative pressure state and an atmospheric pressure state and cools a processed substrate transferred from the first and second process chambers, and the vacuum transfer chamber that is adjacent to the cooling chamber and has a vacuum transfer machine to transfer the substrate under the negative pressure; a substrate processing step of performing substrate processing for forming a semiconductor device on the substrate under the negative pressure in the first and second process chambers; a substrate cooling step of cooling the processed substrate unloaded from the first and second process chambers in the cooling chamber; a timing determination step of determining a timing for the atmospheric transfer machine to take out the substrate from the housing vessel based on a recipe remaining time, which is a remaining time of the substrate processing, and an approach time, which is a time from when the substrate is taken out from the housing vessel till when the substrate is mounted to the vacuum transfer machine, in the second process chamber, when the substrate is transferred to the second process chamber from the housing vessel after starting the substrate processing in the first and second process chambers; and a cooling chamber reduced pressure step of setting the cooling chamber to be the negative pressure from the atmospheric pressure based on the recipe remaining time and a cooling remaining time, which is a remaining time of substrate cooling in the cooling chamber, when the processed substrate is unloaded from the second process chamber after unloading the processed substrate from the first process chamber.

Supplementary Note 29

According to still another aspect of the present disclosure, there is provided a substrate processing apparatus, including: first and second process chambers that process a substrate; one or more housing vessels that house the substrate; a substrate transfer chamber that has a substrate transfer machine to transfer the substrate between the first and second process chambers, and the housing vessel; and a control section that determines a timing for the substrate transfer machine to take out the substrate from the housing vessel based on a recipe remaining time, which is a remaining time of substrate processing, and an approach time, which is a time from when the substrate is taken out from the housing vessel till when the substrate is mounted to the substrate transfer machine in the second process chamber when the substrate is transferred from the housing vessel to the first and second process chambers, the substrate processing is started in the first and second process chambers, and thereafter, the substrate is transferred from the housing vessel to the second process chamber.

This application be benefit of the priority based on Japanese Patent Application No. 2013-082121 filed on Apr. 10, 2013, the entire content of which is herein incorporated by reference.

INDUSTRIAL APPLICABILITY

For example, the present disclosure relates to the substrate processing apparatus that processes the substrate such as the semiconductor wafer, and particularly, can be applied generally to the transport control technique of the substrate in a substrate processing apparatus that performs processing of one or multiple substrates in one process chamber.

REFERENCE SIGNS LIST 10 control section (controller)
11 operation section controller
11s operation display section
11m memory section
13 transfer system controller
13m memory section
14 process chamber controller
14m memory section
15 pressure controller
16 switching hub
17 sequencer
18 SW digital I/O
19 valve digital I/O
20 carrier ID memory section
21 communication section
30 memory section
31 network
32 signal line
50 host computer
100 substrate processing apparatus
AU wafer aligner
AR atmospheric transfer robot (atmospheric transfer machine)
EFEM atmospheric transfer chamber
FD1 to FD3 FOUP door
FP1 to FP3 FOUP (housing vessel)
LGA1, LGA2 atmosphere side gate valve
LGV1, LGV2 vacuum side gate valve
LH1, LH2 substrate holding stage
LM1, LM2 chamber serving as both preliminary chamber and cooling chamber
LP1 to LP3 load port (housing vessel mounting section)
PGV1, PGV2 process chamber gate valve
PM1 to PM2 process chamber
ST1, ST2 substrate mounting stage
TM vacuum transfer chamber
VR vacuum transfer robot (vacuum transfer machine)
W wafer (substrate)

The invention claimed is:

1. A substrate processing apparatus comprising:
a plurality of process chambers that process a substrate;
a mounting section on which one or more housing vessels, that house the substrate, is mounted;
a vacuum transfer chamber that has a vacuum transfer machine to transfer the substrate under a negative pressure;
an atmospheric transfer chamber that has an atmospheric transfer machine to transfer the substrate under an atmospheric pressure; and
a control section that determines a timing for the atmospheric transfer machine to take out the substrate from the housing vessel based on a recipe remaining time, which is a remaining time of substrate processing in each of the plurality of process chambers, and an approach time, which is a time from when the substrate is taken out from the housing vessel till when the substrate is mounted to the vacuum transfer machine, when the substrate is transferred from the housing vessel to a predetermined process chamber among the process chambers after the substrate is transferred to the plurality of process chambers from the housing vessel mounted to the mounting section via the atmospheric transfer chamber and the vacuum transfer chamber and the substrate processing is started in the plurality of process chambers.

2. The substrate processing apparatus according to claim 1, the apparatus further comprising:
a cooling chamber that of switches a negative pressure state and an atmospheric pressure state, and cools a processed substrate transferred from the plurality of process chambers,
wherein the control section controls the cooling chamber to be the negative pressure from the atmospheric pressure based on a recipe remaining time, which is a remaining time of the substrate processing in the process chamber other than the predetermined process chamber, and a cooling remaining time, which is a remaining time of substrate cooling in the cooling chamber, when the processed substrate is unloaded from the process chamber other than the predetermined process chamber after unloading the processed substrate from the predetermined process chamber.

3. The substrate processing apparatus according to claim 2,
wherein the control section controls the cooling chamber to be the negative pressure from the atmospheric pressure when the recipe remaining time is equal to or less than the cooling remaining time.

4. The substrate processing apparatus according to claim 2,
wherein the control section controls the cooling chamber to be the negative pressure from the atmospheric pressure based on a processing and unloading time, which is a total time of the recipe remaining time and a processed substrate unloading time as a time required for unloading the processed substrate from the predetermined process chamber, and a cooling and evacuation time, which is a total time of the cooling remaining time, a cooled substrate unloading time as a time required for unloading a cooled substrate from the cooling chamber, and an evacuation time as a time required for the cooling chamber to be at the negative pressure from the atmospheric pressure.

5. The substrate processing apparatus according to claim 4,
wherein the control section controls the cooling chamber to be at the negative pressure from the atmospheric pressure when the processing and unloading time is equal to or less than the cooling and evacuation time.

6. The substrate processing apparatus according to claim 1,
wherein the control section delays a timing for the atmospheric transfer machine to take out an unprocessed substrate from the substrate housing vessel until the unloading of the processed substrate ends when the processed substrate is unloaded from the predetermined process chamber.

7. The substrate processing apparatus according to claim 1,
wherein the control section controls the atmospheric transfer machine to take out the substrate from the housing vessel when the recipe remaining time is equal to or less than the approach time.

8. A non-transitory computer-readable recording medium in which a program is recorded to be readable, the program to be executed by a substrate processing apparatus, the substrate processing apparatus including:
a plurality of process chambers that process a substrate;
a vacuum transfer chamber that has a vacuum transfer machine to transfer the substrate under a negative pressure;
an atmospheric transfer chamber that has an atmospheric transfer machine to transfer the substrate under an atmospheric pressure; and
a control section that transfers the substrate to the process chamber via the atmospheric transfer chamber and the vacuum transfer chamber,
the program causing the control section to execute a timing determination step of determining a timing for the atmospheric transfer machine to take out the substrate from the housing vessel based on a recipe remaining time, which is a remaining time of substrate processing in a predetermined process chamber, and an approach time, which is a time until the substrate is mounted to the vacuum transfer machine, when the substrate is transferred to the predetermined process chamber after starting the substrate processing in the plurality of process chambers.

9. The non-transitory computer-readable recording medium in which a program is recorded to be readable according to claim 8,
the program to be executed by the substrate processing apparatus further including a cooling chamber that cools the processed substrate transferred from the process chamber,
the program causing the control section to execute: a cooling chamber reduced pressure step of setting the cooling chamber to be the negative pressure from the atmospheric pressure based on a recipe remaining time, which is a remaining time of the substrate processing in the process chamber other than the predetermined process chamber, and a cooling remaining time, which is a remaining time of substrate cooling in the cooling chamber, when the processed substrate is unloaded from the process chamber other than the predetermined process chamber after unloading the processed substrate from the predetermined process chamber; and a substrate cooling step of cooling the processed substrate unloaded from the plurality of process chambers.

10. A method of manufacturing semiconductor device, the method comprising:
a substrate transfer step of transferring a substrate to a plurality of process chambers that process the substrate via an atmospheric transfer chamber to which the substrate is transferred under an atmospheric pressure and an vacuum transfer chamber to which the substrate is transferred under a negative pressure;
a substrate processing step of performing a predetermined processing to the substrate in the plurality of process chambers; and
a timing determination step of determining a timing for the atmospheric transfer machine to transfer the substrate based on a recipe remaining time, which is a remaining time of substrate processing in each of the plurality of process chambers, and an approach time, which is a time until the substrate is mounted to the vacuum transfer machine, when the substrate is transferred to a predetermined process chamber among the plurality of process chambers after starting the substrate processing in the plurality of process chambers.

11. The method of manufacturing semiconductor device according to claim 10, the method further comprising:
a cooling chamber reduced pressure step of setting the cooling chamber to be the negative pressure from the atmospheric pressure based on a recipe remaining time, which is a remaining time of substrate processing in the process chamber other than the predetermined process chamber among the plurality of process chambers, and a cooling remaining time, which is a remaining time of substrate cooling in the cooling chamber, when the processed substrate is unloaded from the process chamber other than the predetermined process chamber among the plurality of process chambers after unloading the processed substrate from the predetermined process chamber; and
a substrate cooling step of cooling the processed substrate unloaded from the plurality of process chambers.

* * * * *